United States Patent
Emura et al.

(10) Patent No.: US 9,780,261 B2
(45) Date of Patent: Oct. 3, 2017

(54) LIGHT-EMITTING ELEMENT AND LIGHT-EMITTING DEVICE INCLUDING A FIRST P-SIDE SEMICONDUCTOR LAYER AND A SECOND P-SIDE SEMICONDUCTOR LAYER

(71) Applicant: NICHIA CORPORATION, Anan-shi, Tokushima (JP)

(72) Inventors: Keiji Emura, Anan (JP); Yoshiki Inoue, Anan (JP); Hiroaki Kageyama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/267,691

(22) Filed: Sep. 16, 2016

(65) Prior Publication Data

US 2017/0084787 A1    Mar. 23, 2017

(30) Foreign Application Priority Data

Sep. 18, 2015    (JP) .................................. 2015-184745

(51) Int. Cl.
*H01L 33/38*    (2010.01)
*H01L 33/62*    (2010.01)
*H01L 33/20*    (2010.01)

(52) U.S. Cl.
CPC ............ *H01L 33/387* (2013.01); *H01L 33/20* (2013.01); *H01L 33/38* (2013.01); *H01L 33/382* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 7,429,755 B2 * | 9/2008 | Hsu ...................... | H01L 33/382 257/100 |
| 8,378,373 B2 * | 2/2013 | Wang ..................... | H01L 33/38 257/99 |

(Continued)

FOREIGN PATENT DOCUMENTS

| JP | 2010-508669 A | 3/2010 |
|---|---|---|
| JP | 2013-098561 A | 5/2013 |

(Continued)

*Primary Examiner* — Andres Munoz
(74) *Attorney, Agent, or Firm* — Foley & Lardner LLP

(57) ABSTRACT

A light-emitting element includes a light transmissive substrate; a first semiconductor stacked body including: a first n-side semiconductor layer, and a first p-side semiconductor layer, the first p-side semiconductor layer having a hole formed therein; a first p-electrode; a first n-electrode having a portion above the first p-electrode, and a portion extending into the hole, the first n-electrode being electrically connected to the first n-side semiconductor layer through the hole; a second semiconductor stacked body including: a second n-side semiconductor layer located around a periphery of the first semiconductor stacked body, and a second p-side semiconductor layer located above the second n-side semiconductor layer and located outside of an inner edge portion of the second n-side semiconductor layer; a second p-electrode; and a second n-electrode having a portion above the second p-electrode, and being electrically connected to the inner edge portion of the second n-side semiconductor layer.

19 Claims, 16 Drawing Sheets

(56) References Cited

U.S. PATENT DOCUMENTS

| | | | |
|---|---|---|---|
| 8,525,212 B2* | 9/2013 | Kim | H01L 33/38 |
| | | | 257/623 |
| 9,343,630 B2* | 5/2016 | Kamiya | H01L 33/382 |
| 2008/0210972 A1* | 9/2008 | Ko | H01L 33/38 |
| | | | 257/99 |
| 2010/0006885 A1* | 1/2010 | Gong | H01L 33/38 |
| | | | 257/99 |
| 2010/0065861 A1* | 3/2010 | Nagai | H01L 25/0753 |
| | | | 257/88 |
| 2012/0007101 A1* | 1/2012 | Yang | H01L 33/387 |
| | | | 257/76 |
| 2014/0209955 A1* | 7/2014 | Kim | H01L 33/62 |
| | | | 257/99 |

FOREIGN PATENT DOCUMENTS

| | | |
|---|---|---|
| JP | 2014-022609 A | 2/2014 |
| WO | WO-2009/019836 A2 | 2/2009 |
| WO | WO-2009/088084 A1 | 7/2009 |
| WO | WO-2010/146783 A1 | 12/2010 |

* cited by examiner

LIGHT-EMITTING ELEMENT AND LIGHT-EMITTING DEVICE INCLUDING A FIRST P-SIDE SEMICONDUCTOR LAYER AND A SECOND P-SIDE SEMICONDUCTOR LAYER

CROSS-REFERENCE TO RELATED APPLICATION

This application claims priority to Japanese Patent Application No. 2015-184745, filed on Sep. 18, 2015, the disclosure of which is hereby incorporated by reference in its entirety.

BACKGROUND

Field of the Invention

The present disclosure relates to a light-emitting element and a light-emitting device.

Description of Related Art

In the field of light-emitting elements used for light-emitting devices, various developments have been made so as to equalize the intensity distribution of light emission at a light extraction surface. For example, the light-emitting elements used for the light-emitting devices disclosed in WO2009/019836 include at least two areas, that is, an edge portion and an area on the inner side of the edge portion. In these light-emitting elements, anode electrodes are respectively provided in the edge portion and the area on the inner side of the edge portion, and a cathode electrode, which is commonly used by the edge portion, is provided in the area on the inner side of the edge portion.

On the other hand, as for the light-emitting elements, the closer a distance between the anode electrode (p-electrode) and the cathode electrode (n-electrode) in the area becomes, the higher electric current density becomes, and a deviation in light emission is likely to occur. In view of the electric current density attributed to the arrangement of the electrodes, it is conceivable that there is some room for improvement of the intensity distribution of light emission.

It is an object of certain embodiments of the present invention to provide a light-emitting element and a light-emitting device in which the intensity distribution of light emission is improved.

SUMMARY

In order to achieve the aforementioned object, a light-emitting element according to one embodiment of the present invention includes a light transmissive substrate; a first semiconductor stacked body including: a first n-side semiconductor layer located above part of the light transmissive substrate, and a first p-side semiconductor layer located above the first n-side semiconductor layer, the first p-side semiconductor layer having a hole formed therein; a first p-electrode located on the first p-side semiconductor layer; a first n-electrode having a portion above the first p-electrode, and a portion extending into the hole, the first n-electrode being electrically connected to the first n-side semiconductor layer through the hole; a second semiconductor stacked body including a second n-side semiconductor layer located above the light transmissive substrate around a periphery of the first semiconductor stacked body in a plan view, and a second p-side semiconductor layer located above the second n-side semiconductor layer and located outside of an inner edge portion of the second n-side semiconductor layer; a second p-electrode located on the second p-side semiconductor layer; and a second n-electrode having a portion above the second p-electrode, and being electrically connected to the inner edge portion of the second n-side semiconductor layer.

Also, a light-emitting element according to another embodiment of the present invention includes a light transmissive substrate; one n-side semiconductor layer located above the light transmissive substrate; a first p-side semiconductor layer located above part of the n-side semiconductor layer, the first p-side semiconductor layer having a hole formed therein; a first p-electrode located on the first p-side semiconductor layer; a first n-electrode having a portion above the first p-electrode, and a portion extending into the hole, the first n-electrode being electrically connected to the n-side semiconductor layer through the hole; a second p-side semiconductor layer located above the n-side semiconductor layer around a periphery of the first p-side semiconductor layer in a plan view; a second p-electrode located on the second p-side semiconductor layer; and a second n-electrode having a portion above the second p-electrode, and being electrically connected to the n-side semiconductor layer in an area between the first p-side semiconductor layer and the second p-side semiconductor layer.

Also, a light-emitting device according to the embodiment of the present invention includes the light-emitting element and an n-side external connection electrode located on a side of the light-emitting element, which side is opposite to the light transmissive substrate, the n-side external connection electrode being connected to the first n-electrode, wherein the first n-electrode includes two arc portions each having an arc shape and extending from a connection portion where the first n-electrode is connected to the n-side external connection electrode in a plan view, and a width of each of the two arc portions in the connection portion where the first n-electrode is connected to the n-side external connection electrode is larger than a width of a tip end portion of the arc portion.

Also, a light-emitting device according to the embodiment of the present invention includes the light-emitting element and an external connection electrode located on a side of the light-emitting element, which side is opposite to the light transmissive substrate, wherein the external connection electrode includes: an n-side external connection electrode connected to the first n-electrode and the second n-electrode; a first p-side external connection electrode connected to the first p-electrode; and a second p-side external connection electrode connected to the second p-electrode.

According to a light-emitting element and a light-emitting device of the embodiment of the present invention, the deviation of electric current density can be alleviated, thereby improving the intensity distribution of light emission.

DETAILED DESCRIPTION

Figure 1:
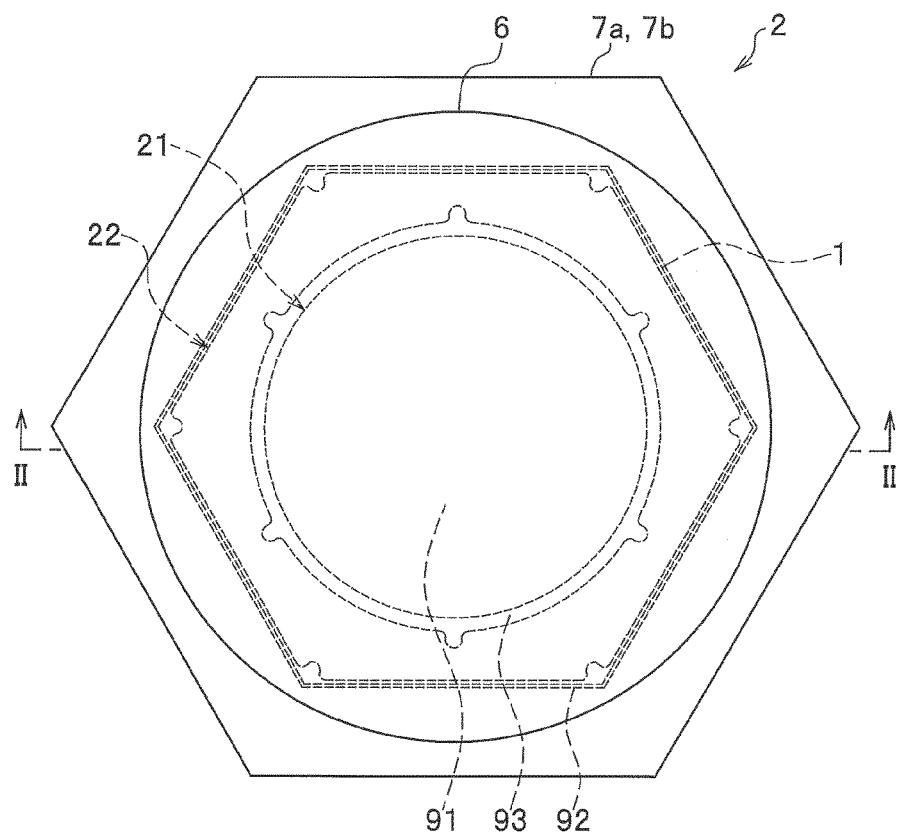
FIG. 1 is a top view schematically illustrating a light source device that includes a light-emitting device according to a first embodiment.

Hereinafter, a light-emitting element and a light-emitting device according to embodiments of the present invention will be described. It is noted that the drawings referred in the following descriptions schematically represent the embodiments of the present invention. Accordingly, the scales, intervals, and positional relation of respective members may be exaggerated, or the illustration of parts of the members may be omitted. Also, the scales, thicknesses, and intervals of respective members may not corresponded between a plan view and its corresponding cross-sectional view. Also, in the description below, in principle, the same term or reference number represents the same or homogeneous member, and therefore its detailed description is appropriately omitted.

In the light-emitting device according to the respective embodiments of the present invention, the terms "up", "down", "left", and "right" are replaced in accordance with the circumstances. In the Description, the terms "up" and "down" represent a relative position between the constituent members in the drawing that is referred to for the purpose of description, but do not intend to represent an absolute position unless specifically stated otherwise. Also, in the case where a certain constituent element or layer is "provided on" another constituent element or layer, this means that the certain constituent element or layer is directly provided on another constituent element or layer or that an intervening constituent element or layer exists.

First Embodiment

[Constitution of Light Source Device]

The constitution of a light source device 2, in which a light-emitting device including a light-emitting element according to a first embodiment of the present invention is used, will be described referring to FIGS. 1 to 7.

Figure 2:
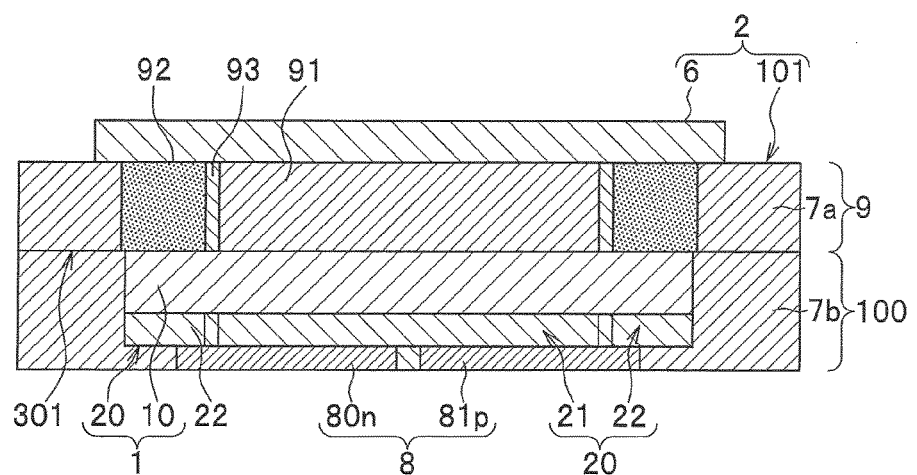
FIG. 2 is a schematic cross-sectional view taken along a line II-II in FIG. 1.
Figure 3:
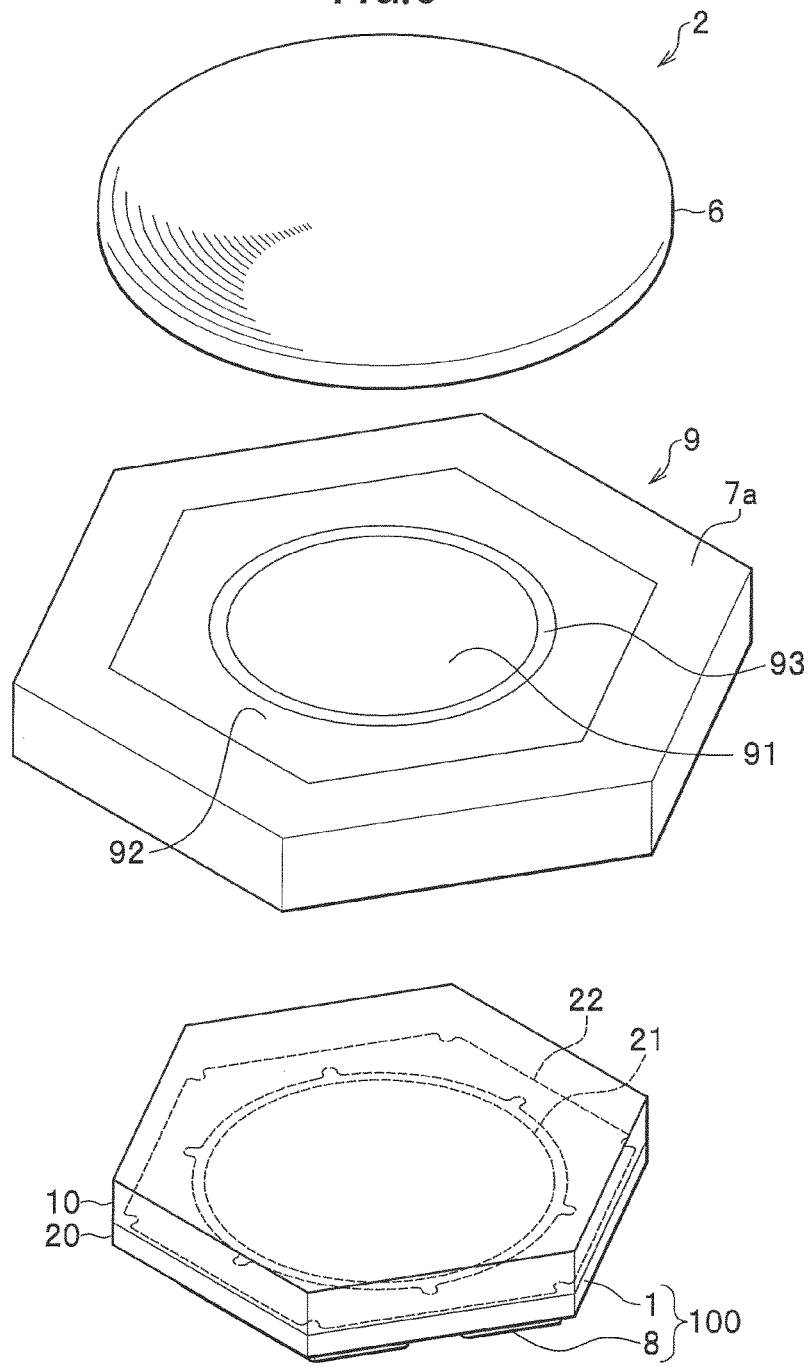
FIG. 3 is an exploded perspective view schematically illustrating the light source device in FIG. 1.

The light source device 2 illustrated in FIGS. 1 and 2 includes a light-emitting device 101 and a Fresnel lens 6. Furthermore, the light-emitting device 101 includes a light-emitting device 100 and a wavelength conversion member 9. As the light source device 2 is exploded and illustrated in FIG. 3, the wavelength conversion member 9 is provided on a side of a light transmissive substrate 10 of the light-emitting device 100, and the Fresnel lens 6 is provided on a surface side of the wavelength conversion member 9. The surface side is opposite to the light transmissive substrate 10. It is noted that in drawings except for FIGS. 1 and 2, the illustration of a light reflective member 7b in the periphery of the light-emitting device 100 is omitted. Besides illumination uses, the aforementioned light source device 2 can be incorporated in external device units, for example, the flash module of a camera. The external device units are exemplified, for example, by mobile terminal devices equipped with a camera, such as smartphones.

[Light-Emitting Device]

The light-emitting device 100 includes a light-emitting element 1 and an external connection electrode 8, and the periphery thereof is covered with the light reflective member 7b. For example, the light-emitting element 1 includes the light transmissive substrate 10 located on a side of a light emission surface and a semiconductor stacked body 20 provided on a surface side of the light transmissive substrate 10, which surface side is opposite to the light emission surface. The external connection electrode 8 is provided on the lower surface side of the semiconductor stacked body 20. It is noted that the outline of the light-emitting element 1 is described herein, but its details are described later. Also, in FIGS. 1 to 4, a side referred to as an upper surface in the description of the drawings corresponds to the upper surface side of the light-emitting element 1, and in FIGS. 5 to 16, a side referred to as an upper surface in the description of the drawings corresponds to the lower surface side of the light-emitting element 1.

The semiconductor stacked body 20 includes an n-side semiconductor layer, an active layer, and a p-side semiconductor layer, for example, from the side of the light transmissive substrate 10 in order. Semiconductor materials such as $In_xAl_yGa_{1-X-Y}N$ ($0 \leq X$, $0 \leq Y$, $X+Y<1$) are employed for each layer constituting the semiconductor stacked body 20. It is noted that a light emission area (corresponding to active layers 21a and 22a described later in the present embodiment) serves as reference, and a semiconductor layer on a side where n-electrodes 61n and 62n described later are connected is the n-side semiconductor layer, and a semiconductor layer on a side where p-electrodes 31p and 32p (light reflective layer) described later are connected is the p-side semiconductor layer.

In the present embodiment, as illustrated in FIGS. 6 to 10, the semiconductor stacked body 20 includes an n-side semiconductor layer 21n formed on the entire surface of the light transmissive substrate 10 and p-side semiconductor layers 21p and 22p, described later, provided on the active layers 21a and 22a on the n-side semiconductor layer 21n. A second p-side semiconductor layer 22p is provided around the periphery of the first p-side semiconductor layer 21p while being separated from the first p-side semiconductor layer 21p. Hereinafter, an area in which the first p-side semiconductor layer 21p and the active layer 21a are arranged, the area that functions as a first light emission portion, is referred to as a first semiconductor area 21 (see FIG. 4). Similarly, an area in which the second p-side semiconductor layer 22p and the active layer 22a are arranged, the area that functions as a second light emission portion, is referred to as a second semiconductor area 22 (see FIG. 4). The first semiconductor area 21 and the second semiconductor area 22 can be independently controlled.

Figure 5:
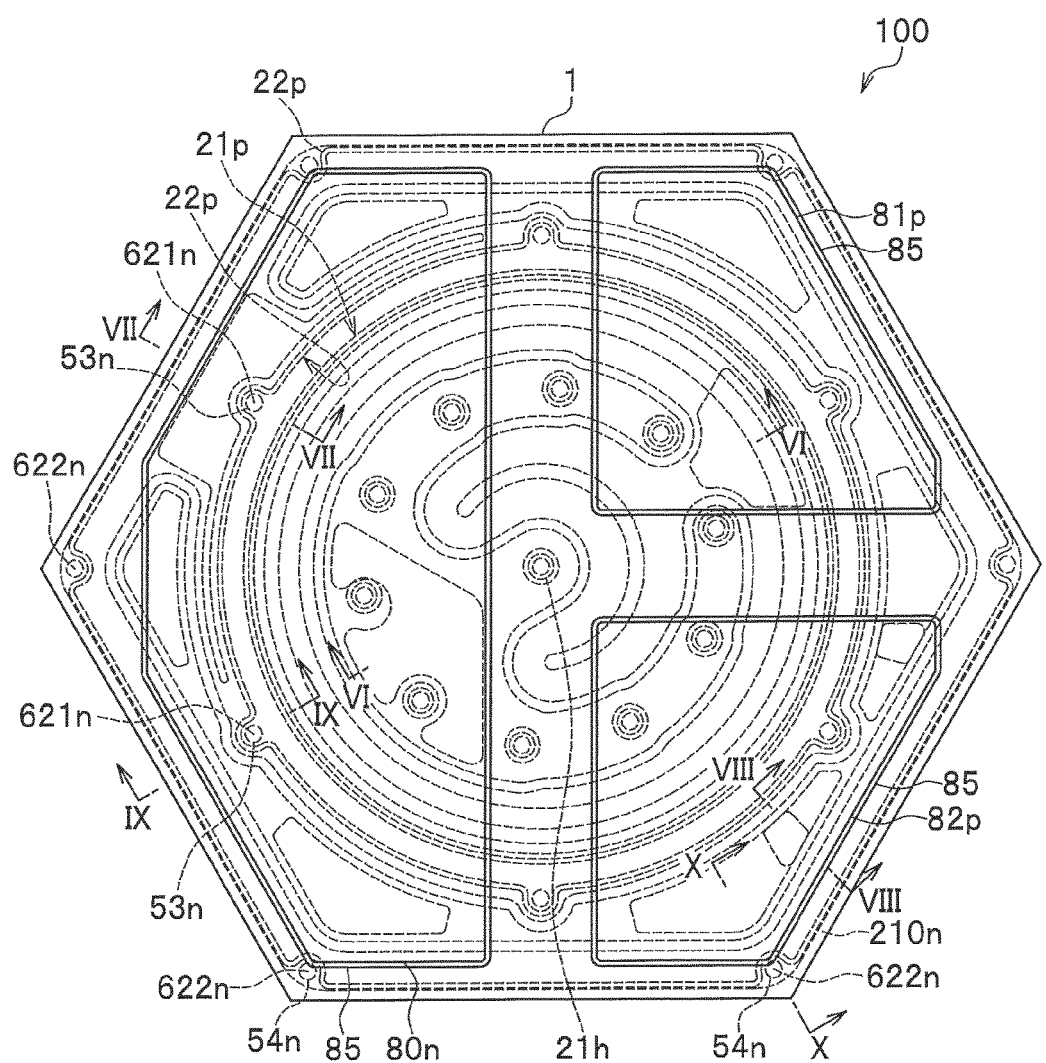
FIG. 5 is a bottom view schematically illustrating the light-emitting device according to the first embodiment.

The external connection electrode 8, for example, as illustrated in FIG. 5, includes an n-side external connection electrode 80n, a first p-side external connection electrode 81p, and a second p-side external connection electrode 82p. The n-side external connection electrode 80n is a common cathode terminal that electrically connects the n-electrode of the first semiconductor area 21 and the n-electrode of the second semiconductor area 22. The mounting of the light-emitting device 100 can be simplified by use of the aforementioned common cathode terminal, and the joining area with the mounting substrate can be widely secured, thereby improving heat dissipation. Also, the first p-side external connection electrode 81p is an anode terminal that is electrically connected to the p-electrode of the first semiconductor area 21, and the second p-side external connection electrode 82p is an anode terminal that is electrically connected to the p-electrode of the second semiconductor area 22.

[Wavelength Conversion Member 9]

The lower surface of the wavelength conversion member 9 faces the light emission surface of the light-emitting element 1, and the wavelength conversion member 9 is provided in such a manner as to cover at least part of the light emission surface of the light-emitting element 1. The wavelength conversion member 9 is excited by part of light emitted from the light-emitting element 1 and emits light for which the wavelength is different from that of the light emitted from the light-emitting element 1. As illustrated in FIG. 1, the wavelength conversion member 9 covers the entire light emission surface of the light-emitting element 1 and is provided in such a manner that the outer circumferential surface (external lateral surface) of the wavelength conversion member 9 is positioned on the outside of the external lateral surface of the light-emitting element 1. The wavelength conversion member 9 includes a first phosphor layer 91, a second phosphor layer 92, and a light transmissive member 93.

The first phosphor layer 91 is circularly provided in such a manner as to cover the first semiconductor area 21 of the light-emitting element 1 in a top view. That is, the first phosphor layer 91 is provided in such a manner as to cover the first p-side semiconductor layer 21p of the light-emitting element 1. Herein, the outer edge of the first phosphor layer 91 is provided in such a manner as to correspond to the outer edge of the first semiconductor area 21. The first phosphor layer 91 includes phosphors (hereinafter referred to as first phosphors) and the light transmissive member including the first phosphors. Similarly the second phosphor layer 92 includes phosphors (hereinafter referred to as second phosphors) and the light transmissive member including the second phosphors. The wavelength of light in the second phosphor layer 92 is longer than the wavelength of light in the first phosphor layer 91.

As one example of the first phosphors, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$ are included, in addition to yttrium aluminum oxide based phosphors (YAG based phosphors).

The second phosphor layer 92 is provided in a hexagonal annular shape around the periphery of the first phosphor layer 91 in a top view and provided in such a manner as to cover the second semiconductor area 22 of the light-emitting element 1. That is, the second phosphor layer 92 is provided in such a manner as to cover the second p-side semiconductor layer 22p of the light-emitting element 1. Herein, the outer edge of the second phosphor layer 92 may be provided in such a manner as to be located outside of the outer edge of the second semiconductor area 22. For example, the second phosphor layer 92 may be provided in a circular shape in the periphery of the first phosphor layer 91.

It is preferable that the second phosphor layer 92 includes nitride based phosphors as the second phosphors. The second phosphor layer 92 is exemplified by $(Sr_{0.97}Eu_{0.03})_2Si_5N_8$, $(Ca_{0.985}Eu_{0.015})_2Si_5N_8$, and $(Sr_{0.679}Ca_{0.291}Eu_{0.03})_2Si_5N_8$, in addition to sialon based phosphors (SiAlON based phosphors).

<Light Transmissive Member 93>

The light transmissive member 93 is concentrically provided between the first phosphor layer 91 and the second phosphor layer 92. Accordingly, the first phosphor layer 91 and the second phosphor layer 92 can be separated from each other, so that the light extracted from the first phosphor layer 91 and the second phosphor layer 92 can be efficiently utilized in the Fresnel lens 6. As the light transmissive resin constituting the light transmissive member 93, thermosetting resin such as silicone resin, silicone modified resin, epoxy resin, and phenol resin, or thermoplastic resin such as polycarbonate resin, acrylic resin, methylpentene resin, and polynorbornene resin can be employed. In particular, silicone resin that excels in light resistance and thermal resistance is preferable. Also, in place of the light transmissive member 93, for example, a light shielding member such as metal films that include Ag, Al, Pt, Rh, and Ir or an alloy for which the main component is made of any of the aforementioned metal may be provided, thereby individually extracting the light from respective phosphor layers 91 and 92. Also, the first phosphor layer 91 and the second phosphor layer 92 may be abutted to each other without providing the light transmissive member 93.

A light reflective member 7a is provided around the periphery of the second phosphor layer 92. The light reflective member 7a is provided in such a manner as to cover the outer circumference of the second phosphor layer 92, and preferably provided in such a manner as to be abutted to the second phosphor layer 92. Accordingly, the light leaked from the lateral surface of the second phosphor layer 92 is suppressed, so that a difference in the output of light extracted from the first phosphor layer 91 and the second phosphor layer 92 can be reduced. Consequently, it is preferable that the light reflective member 7a be abutted to the entire lateral surface of the second phosphor layer 92. Also, as illustrated in FIG. 1, the light reflective member 7a is provided in such a manner that a boundary between the light reflective member 7a and the second phosphor layer 92 is located outside of the outer edge of the light-emitting element 1.

In the example illustrated in FIGS. 1 and 2, the light reflective member 7b is provided in such a manner as to cover part of the lateral surface and the lower surface of the light-emitting element 1 and provided in such a manner that the surface of the external connection electrode 8 is exposed. The light reflective member 7b is abutted to a peripheral edge portion 301 of the light reflective member 7a. The peripheral edge portion 301 is located on the light transmissive substrate 10 side. The light reflective member 7b is abutted to the lower surface of the light reflective member 7a and provided so as to protect the light-emitting element 1 together with the light reflective member 7a. It is noted that another light transmissive member may be provided in such a manner as to stride from the peripheral edge portion 301 of the light reflective member 7a to the lateral surface of the light transmissive substrate 10. Accordingly, the light emitted from the lateral surface of the light-emitting element 1 can be reflected with an interface between the additional light transmissive member and the light reflective member 7b, to the side of the wavelength conversion member 9, so that the efficiency of light extraction can be further improved.

<Light Refractive Members 7a and 7b>

The light reflective members 7a and 7b are of a material having high reflectivity with respect to the light from the light-emitting element 1 of which the reflectivity is, for example, 70 percent or higher. As the light reflective members 7a and 7b, for example, a material in which a substance having light reflectivity is dispersed into light transmissive resin can be employed. As the substance having light reflectivity, for example, titanium oxide, silicon dioxide, titanium dioxide, zirconium dioxide, potassium titanate, alumina, aluminum nitride, boron nitride, and mullite are preferably employed. The substance having light reflectivity, which is formed in a granular, fibrous, or thin-plate shape, can be employed. In particular, the substance formed in the fibrous shape can reduce the coefficient of thermal expansion of the light reflective member 7a and the light reflective member 7b, and for example, a difference in the coefficient of thermal expansion between the light-emitting element 1 and the light reflective members 7a and 7b can be reduced, which is preferable. As resin materials included in the resin having light reflectivity, in particular, it is preferable that light transmissive resin having thermosetting properties such as silicone resin, silicone modified resin, epoxy resin, and phenol resin, be used.

[Fresnel Lens 6]

The Fresnel lens 6 is a member that receives light at one surface (a flat surface) and outputs the light from the other surface (concave and convex surfaces concentrically formed) to be converged forward. The Fresnel lens 6 is mounted in such a manner that the center of the lens approximately corresponds to the center of the first phosphor layer 91 of the wavelength conversion member 9 and the center of the first semiconductor area 21 of the light-emitting element 1. As illustrated in FIG. 1, the Fresnel lens 6 is provided in such a manner as to cover the entire light emission surfaces of the first phosphor layer 91 and the second phosphor layer 92 of the wavelength conversion member 9. It is noted that the outer circumferential edge of the Fresnel lens 6 is arranged in such a manner as to be located outside of the second phosphor layer 92 in a plan view.

The light source device 2 in which the Fresnel lens 6, the light-emitting device 100, and the wavelength conversion member 9 are integrated can be assembled into the external device unit thereof. Alternately, the light source device 2 can be constituted such that the Fresnel lens 6 is provided in the device unit in advance, and the light-emitting device 101 (the light-emitting device 100 and the wavelength conversion member 9) is mounted on the device unit.

Next, the light-emitting element 1 will be described in detail referring to FIGS. 4 to 15.

[Light-Emitting Element 1]

As illustrated in FIGS. 4 to 10, the light-emitting element 1 includes the light transmissive substrate 10, the semiconductor stacked body 20, a first light reflective layer 31p, a second light reflective layer 32p, a barrier layer 40, an interlayer insulation film 50, a first conductive layer 61p, a first n-electrode 61n, a second conductive layer 62p, a second n-electrode 62n, and a protective film 70. The n-side external connection electrode 80n, the first p-side external connection electrode 81p, and a second p-side external connection electrode 82p (hereinafter referred to as the external connection electrode 8 en masse) are provided on the protective film 70.

As illustrated in FIGS. 4 to 6, and 13, the light-emitting element 1 includes the first n-electrode 61n and the first light reflective layer 31p as the first p-electrode provided on the first p-side semiconductor layer 21p, which are located above the first semiconductor area 21. As illustrated in FIGS. 4, 5, 7 to 10, and 13, the light-emitting element 1 includes the second n-electrode 62n and the second light reflective layer 32p as the second p-electrode provided on the second p-side semiconductor layer 22p, which are located above the second semiconductor area 22.

<Light Transmissive Substrate 10>

Figure 4:
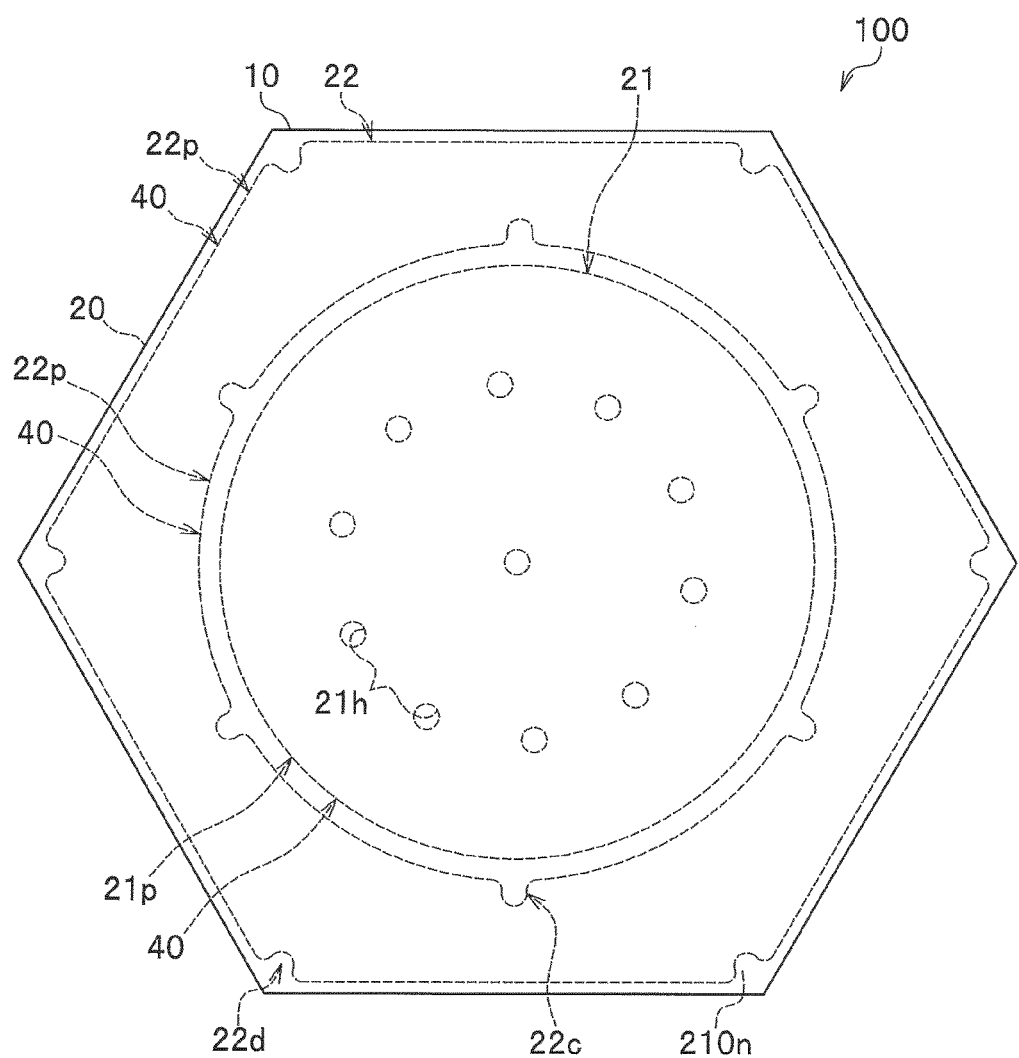
FIG. 4 is a top view schematically illustrating the light-emitting device according to the first embodiment.

As illustrated in FIG. 4, the shape of the light transmissive substrate 10 is an approximately regular hexagon in a plan view. As for the light transmissive substrate 10, for example, materials having insulation properties, such as sapphire ($Al_2O_3$), or semiconductor materials such as gallium nitride (GaN) can be employed.

<Semiconductor Stacked Body 20>

Figure 6:
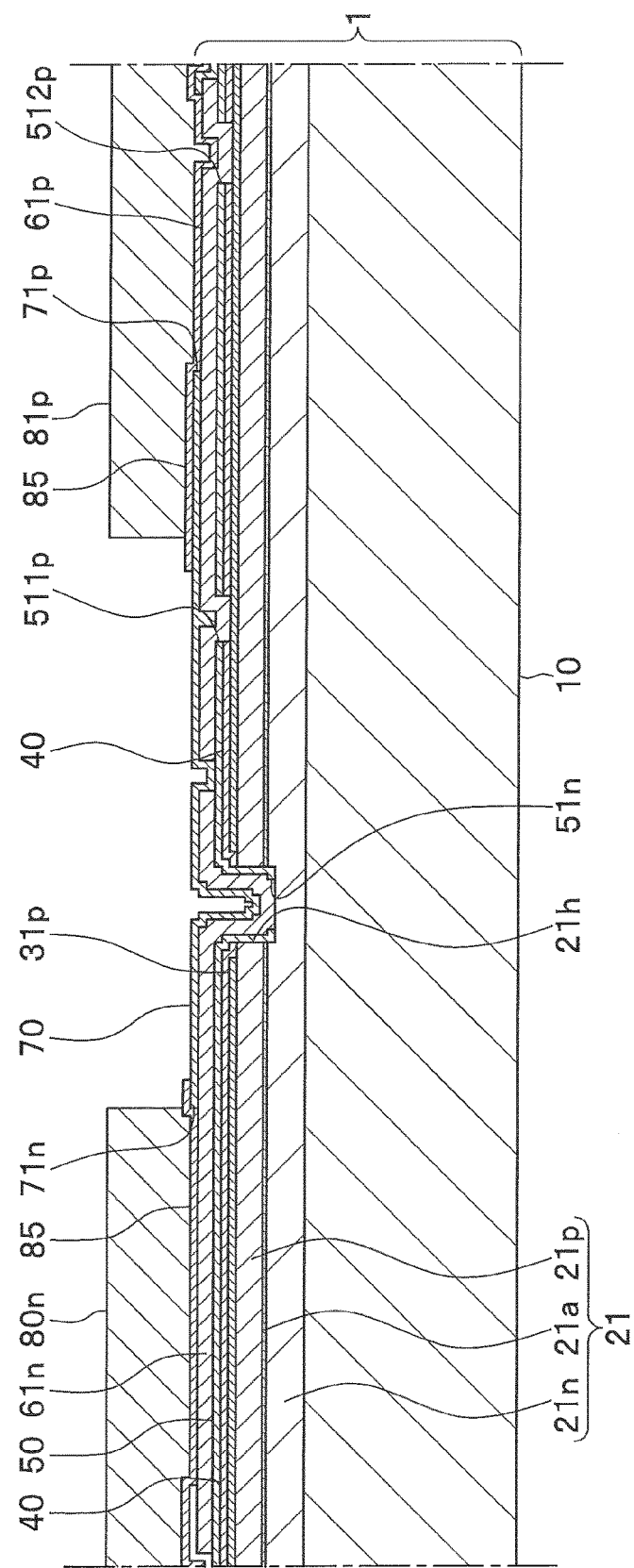
FIG. 6 is a schematic cross-sectional view taken along a line VI-VI in FIG. 5.

As illustrated in FIG. 6, the first semiconductor area 21 of the semiconductor stacked body 20 includes the n-side semiconductor layer 21n, a first active layer 21a, and the first p-side semiconductor layer 21p, which are provided above the light transmissive substrate 10. Also, the semiconductor layers may respectively have a single layer structure or may have a stacked structure with layers having different compositions and thicknesses. In particular, it is preferable that the first active layer 21a be of a single quantum well structure or a multiple quantum well structure.

As illustrated in FIG. 4, it is preferable that the shape of the outer edge of the first p-side semiconductor layer 21p be formed in a circle in a top view so as to efficiently employ the Fresnel lens 6. Also, as illustrated in FIG. 6, the first p-side semiconductor layer 21p is provided above part of the n-side semiconductor layer 21n, and a plurality of holes 21h are formed in the first p-side semiconductor layer 21p. The holes 21h are sections that connect part of the first n-electrode 61n provided above the first p-side semiconductor layer 21p with the n-side semiconductor layer 21n. The holes 21h are arranged along the outer edge portion of the first p-side semiconductor layer 21p, so that an electric current supplied to the first semiconductor area 21 can be more uniformly provided. Furthermore, the plurality of holes 21h are arranged in a circle, so that the Fresnel lens 6 can be more efficiently employed, thereby acquiring light emission. Also, it is preferable that the plurality of holes 21h be substantially arranged with regular intervals apart. Also, in addition to the plurality of holes 21h arranged in a circle, the holes 21h can be arranged in the internal area of the circle. For example, in the case where the hole 21h is arranged in the center of the circle, an electric current supplied to the first semiconductor area 21 can be further uniformly provided.

In the holes 21h, the first p-side semiconductor layer 21p, the first active layer 21a, part of the n-side semiconductor layer 21n are removed, and the n-side semiconductor layer 21n is exposed on the bottom surface of the holes 21h. The lateral surface and the bottom surface of the hole 21h are covered with the interlayer insulation film 50. However, a circular n-side opening 51n is formed in the interlayer insulation film 50 that covers the bottom surface of the hole 21h, and the first n-electrode 61n is connected to the n-side semiconductor layer 21n through the n-side opening 51n. It is noted that the shape of the hole 21h may be formed in, for example, an ellipse in a top view.

The diameter of the hole 21h can be appropriately set in accordance with desired properties. For example, in the case where the diameter of the hole 21h is reduced, an area in which the first p-side semiconductor layer 21p and the first active layer 21a are removed can be reduced, which leads to an increase in the area of light emission. In the case where the diameter of the hole 21h is increased, a contact area between the first n-electrode 61n and the n-side semiconductor layer 21n can be increased, thereby suppressing an increase in forward voltage.

The second semiconductor area 22 of the semiconductor stacked body 20 includes the same stacked structure as that of the first semiconductor area 21 but is different from the first semiconductor area 21 in terms of the arrangement. As illustrated in FIG. 4, it is preferable that the area of the first semiconductor area 21 and the area of the second semiconductor area 22 be equal in a top view in terms of electric current density. As illustrated in FIGS. 7 to 10, the second semiconductor area 22 includes the n-side semiconductor layer 21n, a second active layer 22a, and the second p-side semiconductor layer 22p, which are provided above the light transmissive substrate 10.

As illustrated in FIG. 4, the shape of the outer edge of the second p-side semiconductor layer 22p in a top view is a regular hexagon, which is approximately similar to the shape of the light transmissive substrate 10. Herein, the inner edge of the second p-side semiconductor layer 22p has a circular shape in a top view, the outer edge of the second p-side semiconductor layer 22p has a hexagonal shape in a top view. In other words, the second p-side semiconductor layer 22p has an annular hexagon shape in a plan view so as to efficiently utilize the Fresnel lens 6. Furthermore, it is preferable that a depression 22d be provided on the corner portion of the light transmissive substrate 10, that is, the corner portion corresponding to each vertex of the hexagon, on the outer edge of the second p-side semiconductor layer 22p. As illustrated in FIG. 10, in the depression 22d, the second p-side semiconductor layer 22p, the second active layer 22a, and part of the n-side semiconductor layer 21n are removed, and the n-side semiconductor layer 21n is exposed to the bottom surface of the depression 22d. Accordingly, the second n-electrode 62n can be connected to the exposed n-side semiconductor layer 21n, and the area of light emission can be brought close to a circle in a top view, so that the Fresnel lens 6 can be more efficiently employed, thereby acquiring light emission. Also, the second p-side semiconductor layer 22p is not provided on the outside of the depression 22d, but an outer edge portion 210n (see FIG. 10) of the n-side semiconductor layer 21n is provided. It is noted that the outer edge portion 210n is an area on the n-side semiconductor layer 21n, which is arranged between the outer edge of the semiconductor stacked body 20 and the outer edge of the second semiconductor area 22. In contrast, a depression 22c at a position corresponding to each edge of the light transmissive substrate 10, that is, each edge of the hexagon, is provided on the inner edge of the second semiconductor area 22, and it is preferable that the depressions 22c be substantially arranged with regular intervals apart. The p-side semiconductor layer is not provided between the depressions 22c and the outer edge of the first semiconductor area 21, and the n-side semiconductor layer 21n (see FIG. 9) is exposed. It is noted that the depressions 22c on the inner edge are sections that connect the exposed n-side semiconductor layer 21n with the second n-electrode 62n, as is the same with the depressions 22d on the outer edge. The depressions 22c on the inner edge and the depressions 22d on the outer edge are alternately arranged in the circumferential direction, so that a more uniform electric current can be supplied with the second semiconductor area 22. Also, equivalently the depressions 22c on the inner edge are arranged adjacent to the first semiconductor area 21, so that the depressions 22c can contribute to the dispersion of electric currents in the first semiconductor area 21. As a result, the intensity distribution of light emission can be improved without increasing the number of holes 21h (without reducing the area of light emission) in the first semiconductor area 21.

The lateral surfaces and the bottom surfaces of any of the depressions 22d and 22c are covered with the interlayer insulation film 50. However, circular n-side openings 54n and 53n are formed in the interlayer insulation film 50 that covers the bottom surfaces, and the second n-electrode 62n is connected to the n-side semiconductor layer 21n through the n-side openings 54n and 53n. It is noted that the shape and size of the depressions 22d and 22c can be appropriately set in accordance with desired properties.

<First Light Reflective Layer 31p>

The first light reflective layer 31p is a layer that uniformly disperses the electric current supplied via the first conductive layer 61p with the first p-side semiconductor layer 21p. Also, the first light reflective layer 31p includes good light reflectivity and functions as a layer that reflects the light from the semiconductor stacked body 20 to the side of light extraction surface. As illustrated in FIG. 6, the first light reflective layer 31p is connected to approximately the entire upper surface of the first p-side semiconductor layer 21p. The first light reflective layer 31p includes an opening of which the center is concentric with the hole 21h at a position corresponding to the hole 21h of the n-side semiconductor layer 21n (see FIG. 11). Herein, approximately the entire surface means an area except for the outer edge on the upper surface of the first p-side semiconductor layer 21p, and except for the inner edges in the vicinity of the plurality of holes 21h on the upper surface of the first p-side semiconductor layer 21p. For example, the first light reflective layer 31p preferably has an area of not lower than 90 percent in the area of the upper surface of the first p-side semiconductor layer 21p.

<Second Light Reflective Layer 32p>

The second light reflective layer 32p has the same constitution as that of the first light reflective layer 31p but is different from the first light reflective layer 31p in terms of arrangement. Specifically, as illustrated in FIGS. 7 to 10, the second light reflective layer 32p is connected to approximately the entire upper surface of the second p-side semiconductor layer 22p. The second light reflective layer 32p includes depressions having the same shape at positions corresponding to the depressions 22d and 22c of the second p-side semiconductor layer 22p (see FIG. 11). Metal materials having good light reflectivity can be employed for the first light reflective layer 31p and the second light reflective layer 32p. For example, Ag, Al, Pt, Rh, and Ir or an alloy for which the main component is made of any of the aforementioned metal can be preferably provided. Also, a single layer or multiple layers made of the aforementioned metal materials can be used for the first light reflective layer 31p and the second light reflective layer 32p.

<Barrier Layer 40>

Figure 10:
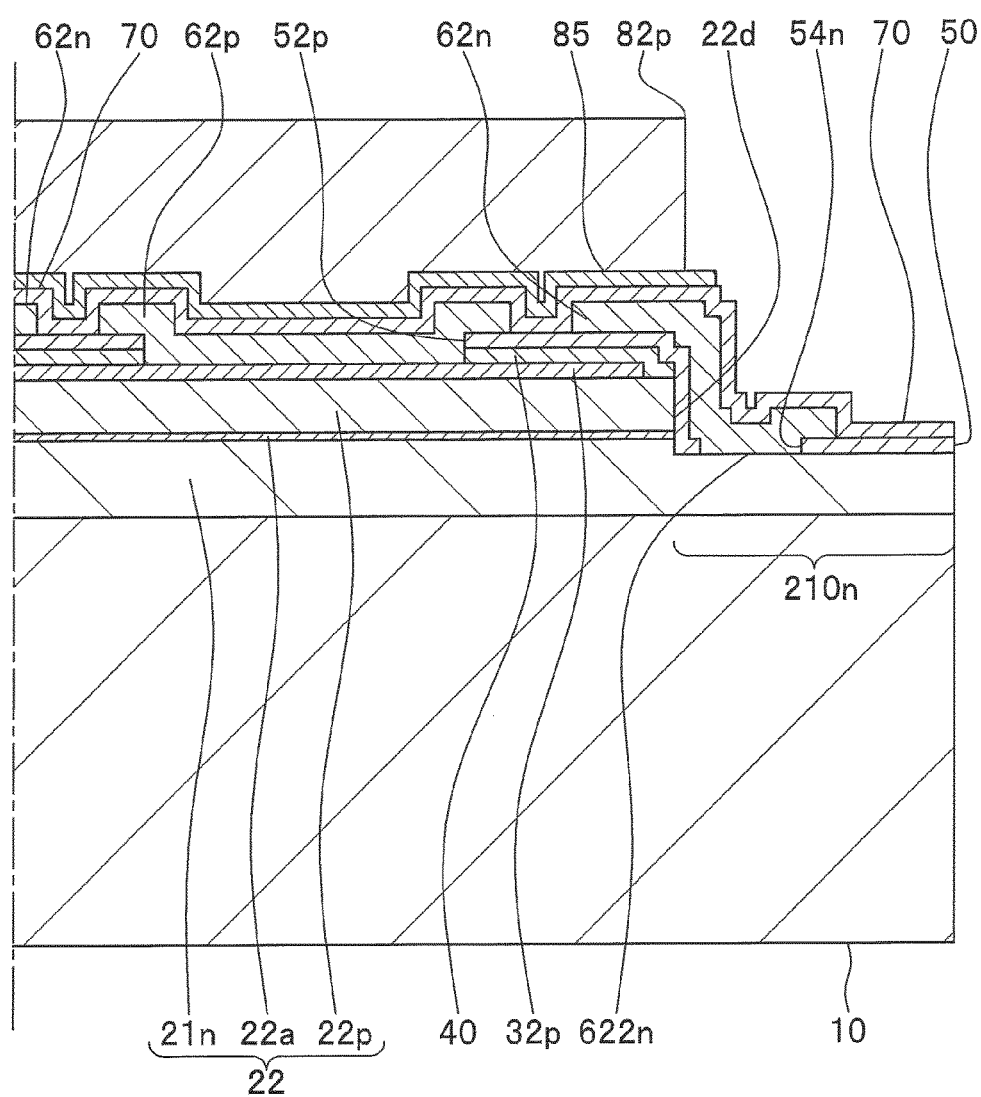
FIG. 10 is a schematic cross-sectional view taken along a line X-X in FIG. 5.
Figure 11:
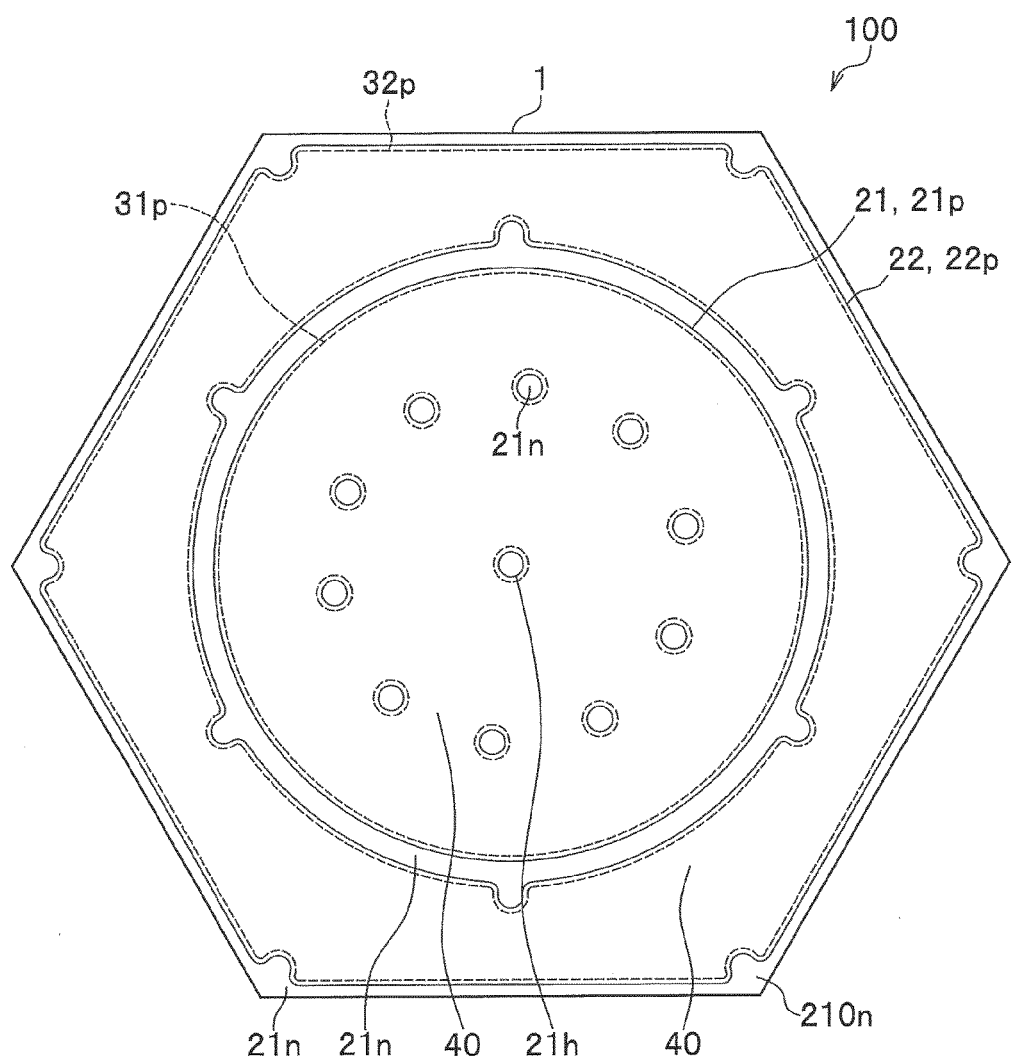
FIG. 11 is an explanatory view schematically illustrating the arrangement area of a barrier layer in the light-emitting device according to the first embodiment.

The barrier layer 40 is a layer that prevents the migration of the metal materials constituting the first light reflective layer 31p and the second light reflective layer 32p. As illustrated in FIG. 11, the barrier layer 40 is provided in such a manner as to cover the first light reflective layer 31p and the second light reflective layer 32p. More specifically, as illustrated in FIG. 6, the barrier layer 40 is provided in such a manner as to cover part of the upper surface and the lateral surface of the first light reflective layer 31p (the first p-electrode). Also, as illustrated in FIGS. 7 to 10, the barrier layer 40 is provided in such a manner as to cover part of the upper surface and the lateral surface of the second light reflective layer 32p (the second p-electrode). It is noted that the arrangement of the barrier layer 40 is the same with the arrangement of respective p-side semiconductor layers 21p and 22p in a plan view. As the barrier layer 40, metal oxides or metal nitrides having barrier properties can be used, and for example, at least one type of oxide or nitride selected from a group consisting of Si, Ti, Zr, Nb, Ta, and Al can be used. Also, a single layer or multiple layers made of the oxide or nitride out of any of the aforementioned metal materials can be used for the barrier layer 40.

<Interlayer Insulation Film 50>

Figure 12:
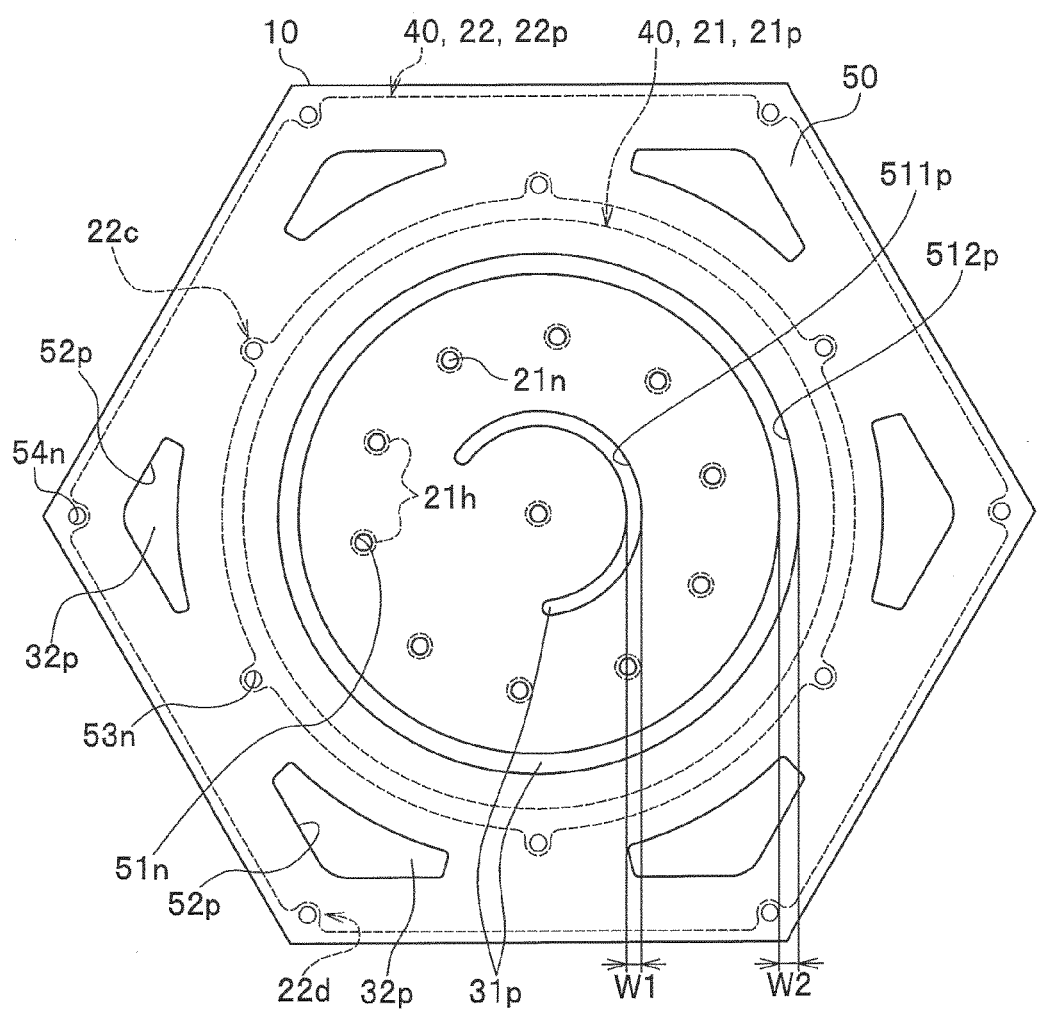
FIG. 12 is an explanatory view schematically illustrating the arrangement area of an interlayer insulation film in the light-emitting device according to the first embodiment.

The interlayer insulation film 50 is provided on the semiconductor stacked body 20 and functions as an insulation film that causes the first n-electrodes 61n and the second n-electrode 62n connected to the n-side semiconductor layer 21n to extend above the p-side semiconductor layers 21p and 22p respectively. As illustrated in FIG. 12, the interlayer insulation film 50 is provided approximately the entire surface of the semiconductor stacked body 20. Above the first semiconductor area 21, as illustrated in FIG. 6, the interlayer insulation film 50 is provided on the upper surface and the lateral surface of the barrier layer 40 and on the lateral surface of the n-side semiconductor layer 21n. In other words, the interlayer insulation film 50 includes an n-side opening 51n through which the n-side semiconductor layer 21n is exposed on the bottom surface of the hole 21h. The first n-electrode 61n (see FIG. 14) is arranged in an area in which the n-side opening 51n is provided. Also, the interlayer insulation film 50 includes p-side openings 511p and 512p above the first semiconductor area 21. The p-side openings 511p and 512p are openings through which the first p-electrode (the first light reflective layer 31p) is exposed. As illustrated in FIG. 12, the p-side opening 511p is formed in an arc shape, and the p-side opening 512p is formed in an annular shape in such a manner as to surround the p-side opening 511p. Herein, the width W2 of the p-side opening 512p is larger than the width W1 of the p-side opening 511p. The first conductive layer 61p (see FIG. 14) is arranged in the area where the p-side openings 511p and 512p are provided.

In contrast, above the second semiconductor area 22, as illustrated in FIGS. 7 to 10, the interlayer insulation film 50 is provided on the upper surface and the lateral surface of the barrier layer 40 and on the lateral surface of the n-side semiconductor layer 21n. As illustrated in FIG. 12, the interlayer insulation film 50 includes a p-side opening 52p in the vicinity of the corner portion of the light transmissive substrate 10. The p-side opening 52p is an opening through which the second p-electrode (the second light reflective layer 32p) is exposed. The p-side opening 52p is formed in, for example, a polygonal shape having the same angles as those of the corner portion of the light transmissive substrate 10. The second conductive layer 62p (see FIG. 10) is arranged in the area where the p-side opening 52p is provided.

Figure 7:
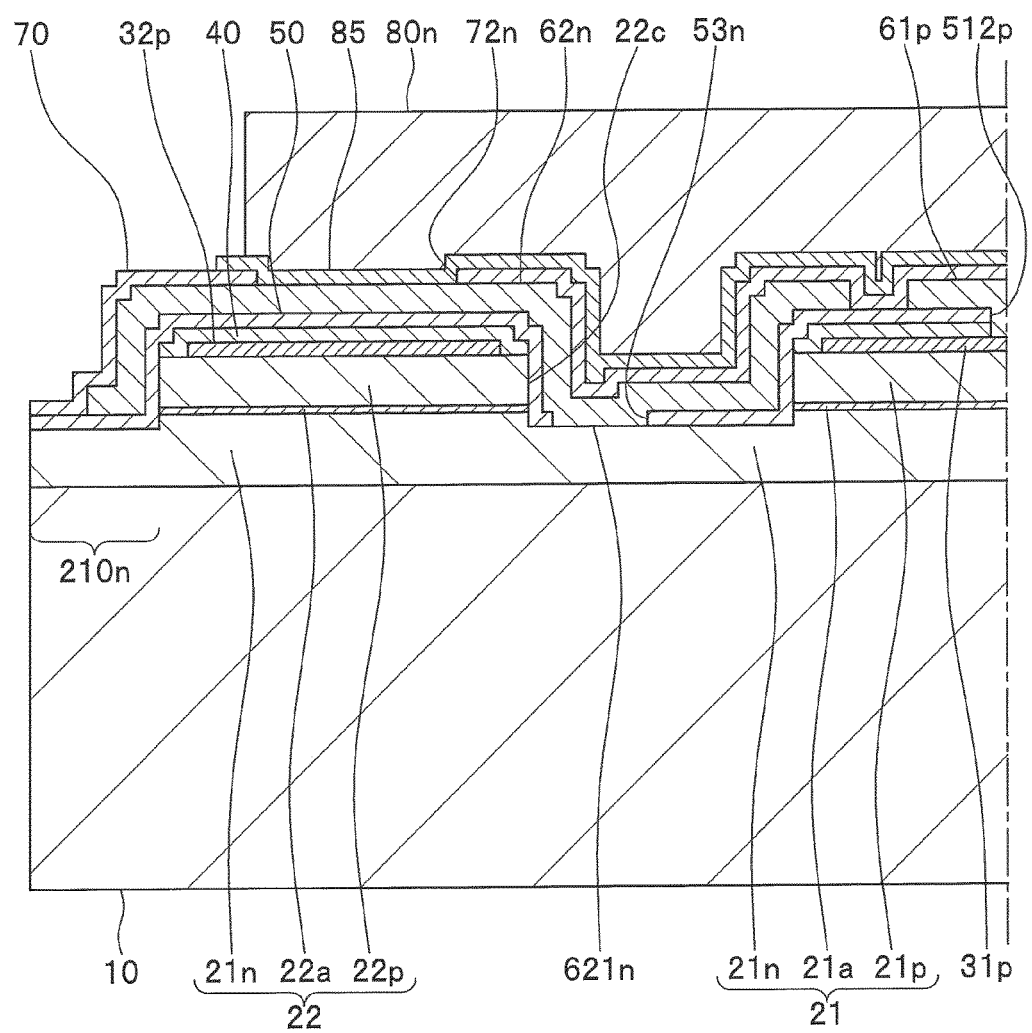
FIG. 7 is a schematic cross-sectional view taken along a line VII-VII in FIG. 5.
Figure 9:
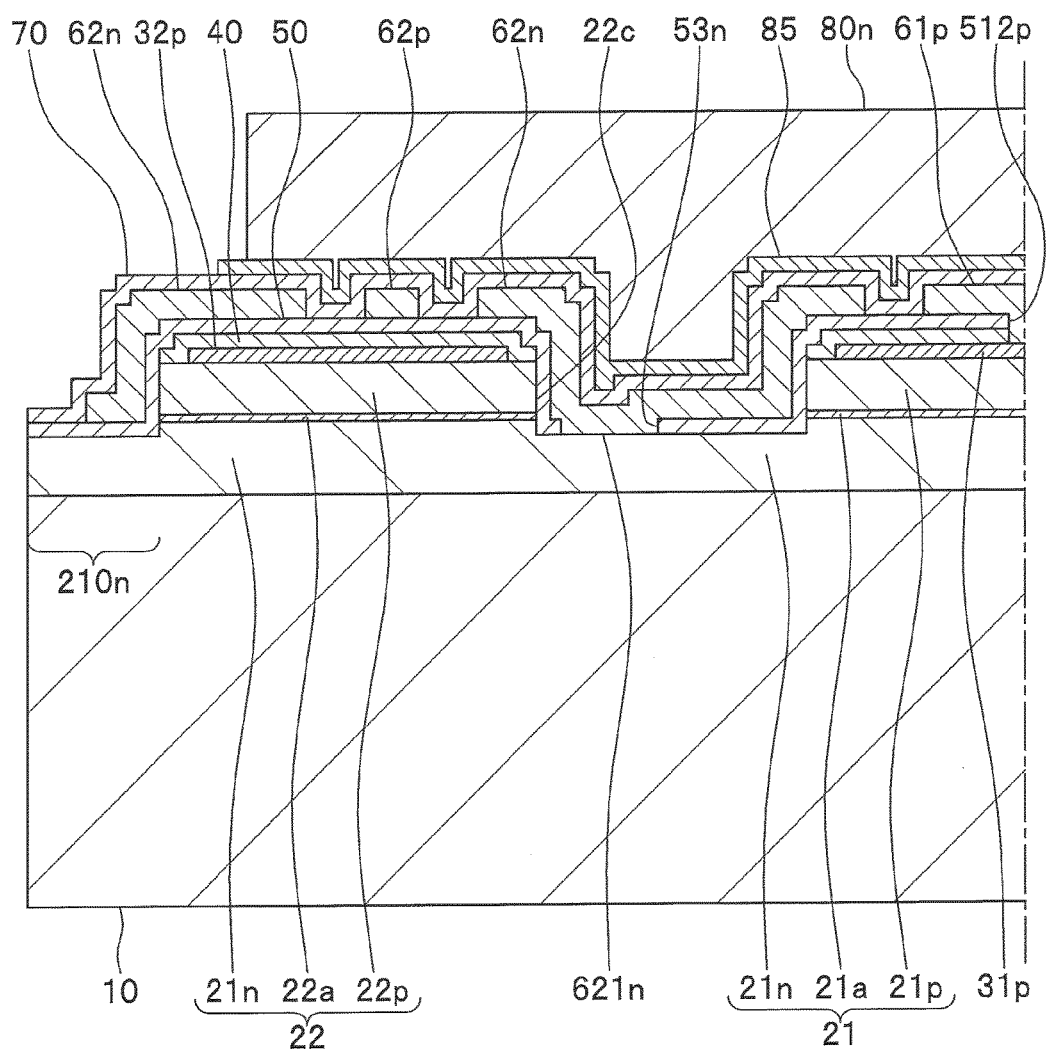
FIG. 9 is a schematic cross-sectional view taken along a line IX-IX in FIG. 5.

Also, as illustrated in FIGS. 7 and 9, the interlayer insulation film 50 includes an n-side opening 53n through which the n-side semiconductor layer 21n is exposed between the first semiconductor area 21 and the second semiconductor area 22. As illustrated in FIG. 12, the n-side opening 53n is provided at a position corresponding to each depression 22c on the inner edge of the second semiconductor area 22. The second n-electrode 62n (see FIG. 9) is arranged in the area where the n-side opening 53n is provided. The second n-electrode 62n and the n-side semiconductor layer 21n are brought into contact with each other through the n-side opening 53n and electrically connected.

Also, as illustrated in FIG. 10, the interlayer insulation film 50 includes an n-side opening 54n through which the n-side semiconductor layer 21n is exposed, in the outer edge portion 210n of the n-side semiconductor layer 21n. As illustrated in FIG. 12, the n-side opening 54n is provided at a position corresponding to each depression 22d of the outer edge of the second semiconductor area 22. The second n-electrode 62n (see FIG. 10) is arranged in the area where the n-side opening 54n is provided. The second n-electrode 62n and the n-side semiconductor layer 21n are brought into contact with each other through the n-side opening 54n and electrically connected.

As the aforementioned interlayer insulation film 50, metal oxides or metal nitrides can be used, and at least one type of oxide or nitride selected from a group consisting of, for example, Si, Ti, Zr, Nb, Ta, and Al can be preferably used. Also, as the interlayer insulation film 50, it may be constituted such that two or more kinds of light transmissive dielectrics having a different refractive index are used and stacked, thereby forming a Distributed Bragg Reflector (DBR) film.

<First n-Electrode 61n>

Figure 13:
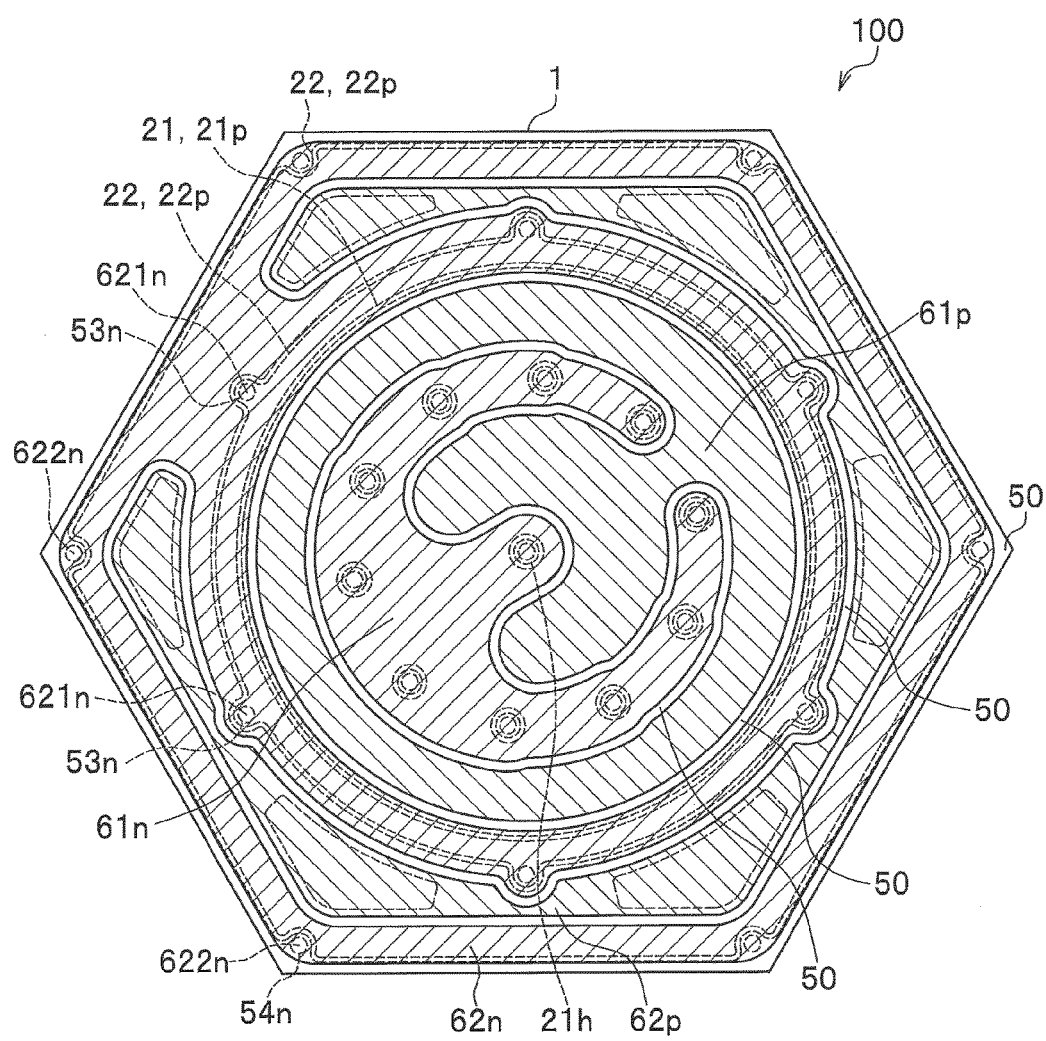
FIG. 13 is an explanatory view schematically illustrating the arrangement areas of an n-electrode and a p-electrode in the light-emitting device according to the first embodiment.
Figure 14:
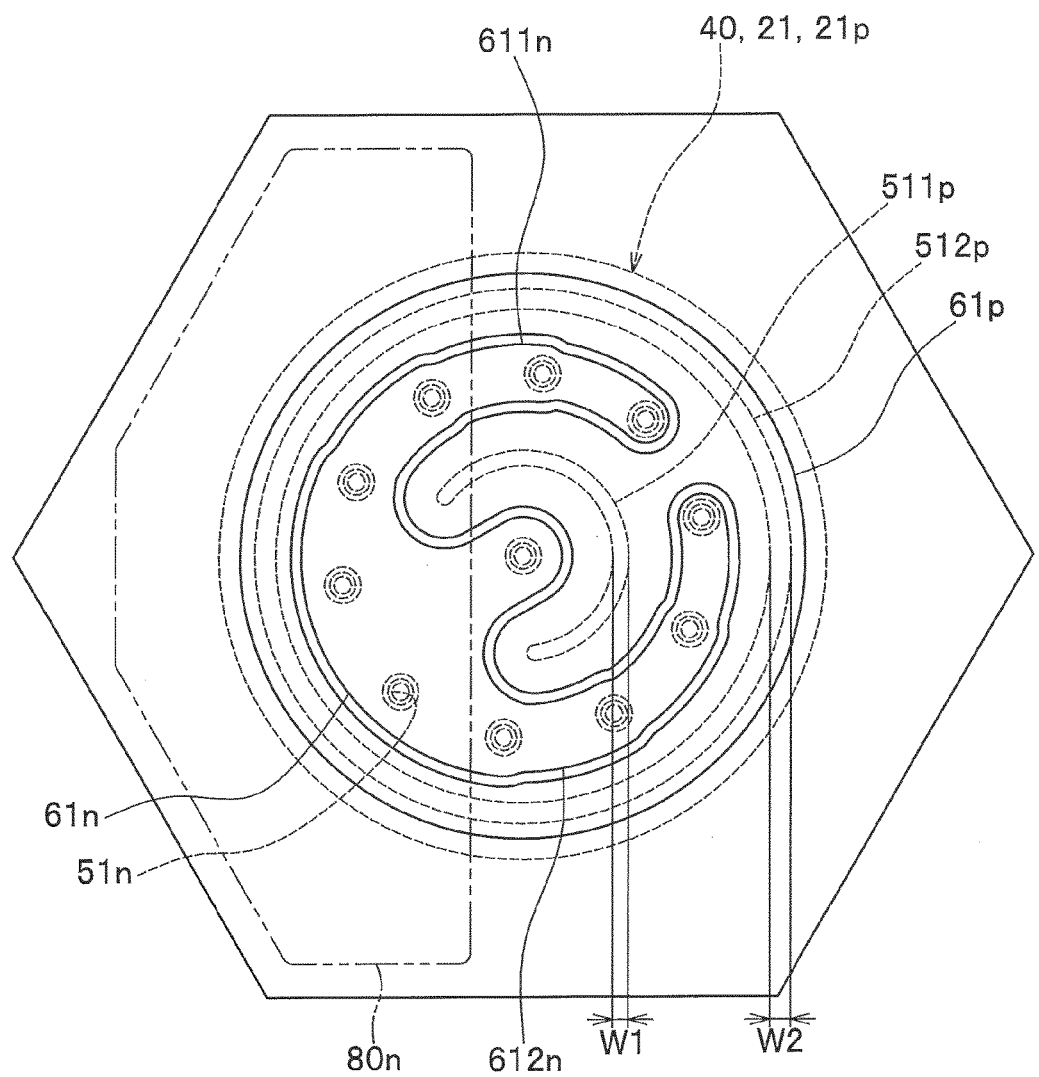
FIG. 14 is an explanatory view schematically illustrating the arrangement areas of a first n-electrode and a first conductive layer in the light-emitting device according to the first embodiment.

The first n-electrode 61n is an n-pad electrode above the first semiconductor area 21 of the light-emitting element 1. The first n-electrode 61n is provided above part of the first p-electrode (the first light reflective layer 31p) via the interlayer insulation film 50. As illustrated in FIG. 6, the first n-electrode 61n is electrically connected to the n-side semiconductor layer 21n through the hole 21h and extended to the upper surface of the interlayer insulation film 50. As illustrated in FIG. 13, the first n-electrode 61n extends along the arrangement area of the plurality of holes 21h above the first semiconductor area 21 and integrally connects the plurality of holes 21h. Thus, the first n-electrode 61n is connected to the n-side semiconductor layer 21n in the surface of the first semiconductor area 21 at sections over a wide range, so that the electric current supplied via the first n-electrode 61n can be uniformly dispersed to the n-side semiconductor layer 21n of the first semiconductor area 21. Furthermore, as illustrated in FIG. 14, the first n-electrode 61n includes two arc portions 611n and 612n each having an arc shape and extending from a connection portion where the first n-electrode 61n is connected to the n-side external connection electrode 80n in a plan view (bottom view). In the arc portions 611n and 612n, a large amount of electric current flows on the connection portion side (base end side) where the n-side external connection electrode 80n is connected, compared with the tip end portion side. The arc portions 611n and 612n are provided in such a manner that the width of the connection portion where the first n-electrode 61n is connected to the n-side external connection electrode 80n is larger than the width of the tip end portion. That is, the respective arc portions 611n and 612n are formed in a tapered shape. Thus, In the arc portions 611n and 612n, the width of the connection portion is greater than the width of the tip end portion, so that the dispersion of the electric current supplied to the tip end portion can be facilitated. As a result, the electric current supplied to each hole 21h that connects the first n-electrode 61n with the n-side semiconductor layer 21n can be uniformly provided.

<First Conductive Layer 61p>

The first conductive layer 61p is a p-pad electrode above the first semiconductor area 21 of the light-emitting element 1. As illustrated in FIG. 6, the first conductive layer 61p is electrically connected to the first light reflective layer 31p in the opening of the barrier layer 40 and extended to the upper surface of the interlayer insulation film 50. The first conductive layer 61p is conducted to the first p-side semiconductor layer 21p via the first light reflective layer 31p. Thus, the first conductive layer 61p together with the first light reflective layer 31p can constitute the first p-electrode. Furthermore, the first conductive layer 61p is also electrically connected to the first p-side external connection electrode 81p via a seed layer 85 through a p-side opening 71p of the protective film 70. Also, as described above, the interlayer insulation film 50 is formed in such a manner that the width W2 of the p-side opening 512p is larger than the width W1 of the p-side opening 511p. As illustrated in FIGS. 12 and 14, the first conductive layer 61p has a first connection portion and a second connection portion each of which is connected to the first light reflective layer 31p. Herein, the first connection portion and the second connection portion each having a shape similar to an outer edge shape of the first p-side semiconductor layer 21p in a plan view (see FIGS. 12 and 14). The first connection portion and the second connection portion are respectively located in an inner area and an outer area of a region encircled by an imaginary line connecting the plurality of the holes 21h along the outer edge portion of the first p-side semiconductor layer 21p in a plan view (see FIGS. 12 and 14). Accordingly, as illustrated in FIG. 14, the width W2 of the second connection portion is larger than the width W1 of the first connection portion. In contrast, as for the first conductive layer 61p, in the case where the width W2 and the width W1 are equal, it tends to be difficult for the electric current to flow in the area on the outside of the imaginary line connecting the plurality of the holes 21h, compared with the area on the inside of the imaginary line. However, the width W2 is larger than the width W1, so that the electric current flowing in the area on the outside of the imaginary line connecting the plurality of the holes 21h and the electric current flowing in the area on the inside of the imaginary line can be equalized in the first conductive layer 61p.

Furthermore, as for the first conductive layer 61p, it is preferable that the second connection portion and the first connection portion be separated from each other, because the electric current tends to converge in the first connection portion compared with the second connection portion. Accordingly, the deviation in the distribution of the electric current can be alleviated between the first connection portion and the second connection portion in the first conductive layer 61p.

<Second n-Electrode 62n>

The second n-electrode 62n is an n-pad electrode above the second semiconductor area 22 of the light-emitting element 1. The second n-electrode 62n is provided above part of the second p-electrode (the second light reflective layer 32p) via the interlayer insulation film 50 and connected to the n-side semiconductor layer 21n in an area between the first p-side semiconductor layer 21p and the second p-side semiconductor layer 22p. More specifically, the second n-electrode 62n includes a plurality of inner edge connection portions 621n (see FIGS. 5 and 9) connected to the n-side semiconductor layer 21n in the area between the first p-side semiconductor layer 21p and the second p-side semiconductor layer 22p. The n-side semiconductor layer 21n is connected to the second n-electrode 62n arranged above the second p-side semiconductor layer 22p via the inner edge connection portions 621n, so that the electric current supplied to the second semiconductor area 22 can be equalized. The plurality of inner edge connection portions 621n are arranged along the inner edge portion of the second p-side semiconductor layer 22p. Accordingly, the plurality of inner edge connection portions 621n are arranged adjacent to the outer edge portion of the first p-side semiconductor layer 21p, so that the inner edge connection portions 621n can contribute to the dispersion of the electric current on the outer edge portion of the first p-side semiconductor layer 21p. Additionally, by use of the inner edge connection portions 621n, it is possible to reduce the number of holes 21h which are formed by removal of the first p-side semiconductor layer 21p on the n-side semiconductor layer 21n in the first semiconductor area 21. Accordingly, it is possible to equalize the distribution of the electric current without reducing the light emission area. Furthermore, as illustrated in FIG. 12, the n-side opening 53n of the interlayer insulation film 50 is provided at a position corresponding to each depression 22c on the inner edge of the second semiconductor area 22, so that the plurality of inner edge connection portions 621n are arranged nearer to the second p-side semiconductor layer 22p than ro the first p-side semiconductor layer 21p. Accordingly, the plurality of inner edge connection portions 621n contribute toward current diffusion in the first p-side semiconductor layer 21p, and they also markedly contribute toward current diffusion in the second p-side semiconductor layer 22p.

Also, the second n-electrode 62n includes a plurality of outer edge connection portions 622n (see FIGS. 5 and 10) connected to the outer edge portion 210n of the n-side semiconductor layer 21n. As illustrated in FIG. 5, the outer edge connection portions 622n are respectively arranged at corner portions of the light transmissive substrate 10, that is, the corner portions corresponding to the vertices of the hexagonal shape. Accordingly, the electric current can be sufficiently dispersed up to the corner portions of the second p-side semiconductor layer 22p.

As illustrated in FIG. 12, the n-side opening 53n and the n-side opening 54n are alternately arranged in the circumferential direction in the interlayer insulation film 50, and as illustrated in FIG. 4, the depression 22c on the inner edge and the depression 22d on the outer edge in the second semiconductor area 22 are alternately arranged in the circumferential direction. Accordingly, as illustrated in FIG. 5, the inner edge connection portions 621n and the outer edge connection portions 622n are alternately arranged in the circumferential direction on the second n-electrode 62n. Consequently, as for the semiconductor stacked body 20, by the arrangement of the inner edge connection portions 621n and the outer edge connection portions 622n, it is possible to minimize the number of holes 21h which are formed by removal of the first p-side semiconductor layer 21p on the n-side semiconductor layer 21n, so that the dispersion of the electric current on the second p-side semiconductor layer 22p can be equalized.

<Second Conductive Layer 62p>

Figure 8:
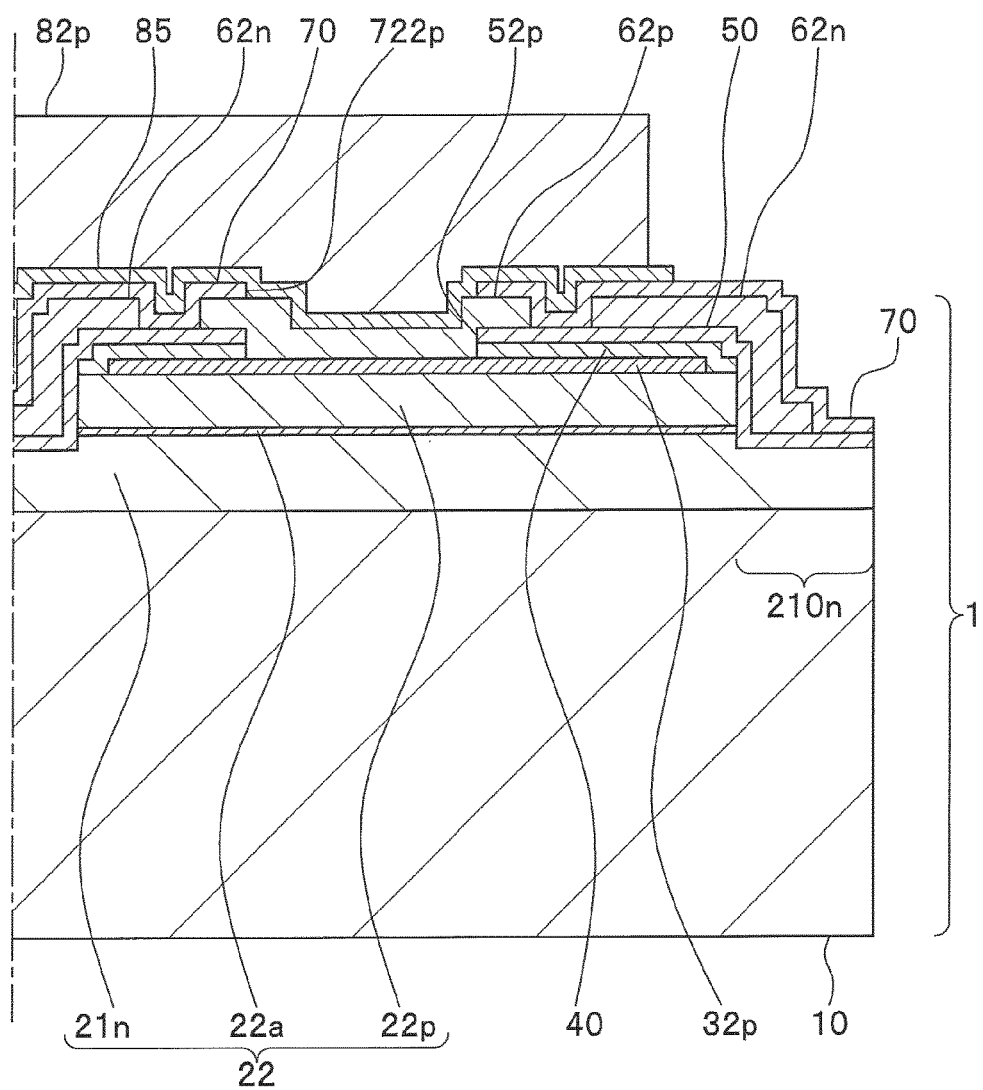
FIG. 8 is a schematic cross-sectional view taken along a line VIII-VIII in FIG. 5.

The second conductive layer 62p is a p-pad electrode above the second semiconductor area 22 of the light-emitting element 1. As illustrated in FIG. 8, the second conductive layer 62p is electrically connected to the second light reflective layer 32p in the p-side opening 52p of the interlayer insulation film 50 and extended up to the upper surface of the interlayer insulation film 50. Also, the second conductive layer 62p is conducted with the second p-side semiconductor layer 22p via the second light reflective layer 32p. Thus, the second conductive layer 62p together with the second light reflective layer 32p can constitute the second p-electrode. Furthermore, the second conductive layer 62p is electrically connected to the second p-side external connection electrode 82p via the seed layer 85 through the p-side openings 721p and 722p of the protective film 70.

The metal materials can be employed for the respective pad electrodes (the first n-electrode 61n, the second n-electrode 62n, the first conductive layer 61p, and the second conductive layer 62p), and for example, single metal such as Ag, Al, Ni, Rh, Au, Cu, Ti, Pt, Pd, Mo, Cr, and W or an alloy for which the main component is made of any of the aforementioned metal, can be preferably used. More preferably, single metal such as Ag, Al, Pt, and Rh, which excels in light reflectivity, or an alloy, for which the main component is made of any of the aforementioned metal, can be used. In the case where the alloy is used, nonmetal elements such as Si may be contained as a composite element, for example, such as AlSiCu alloy. Also, a single layer or multiple layers made of the aforementioned metal materials can be used for each pad electrode.

<Protective Film 70>

Figure 15:
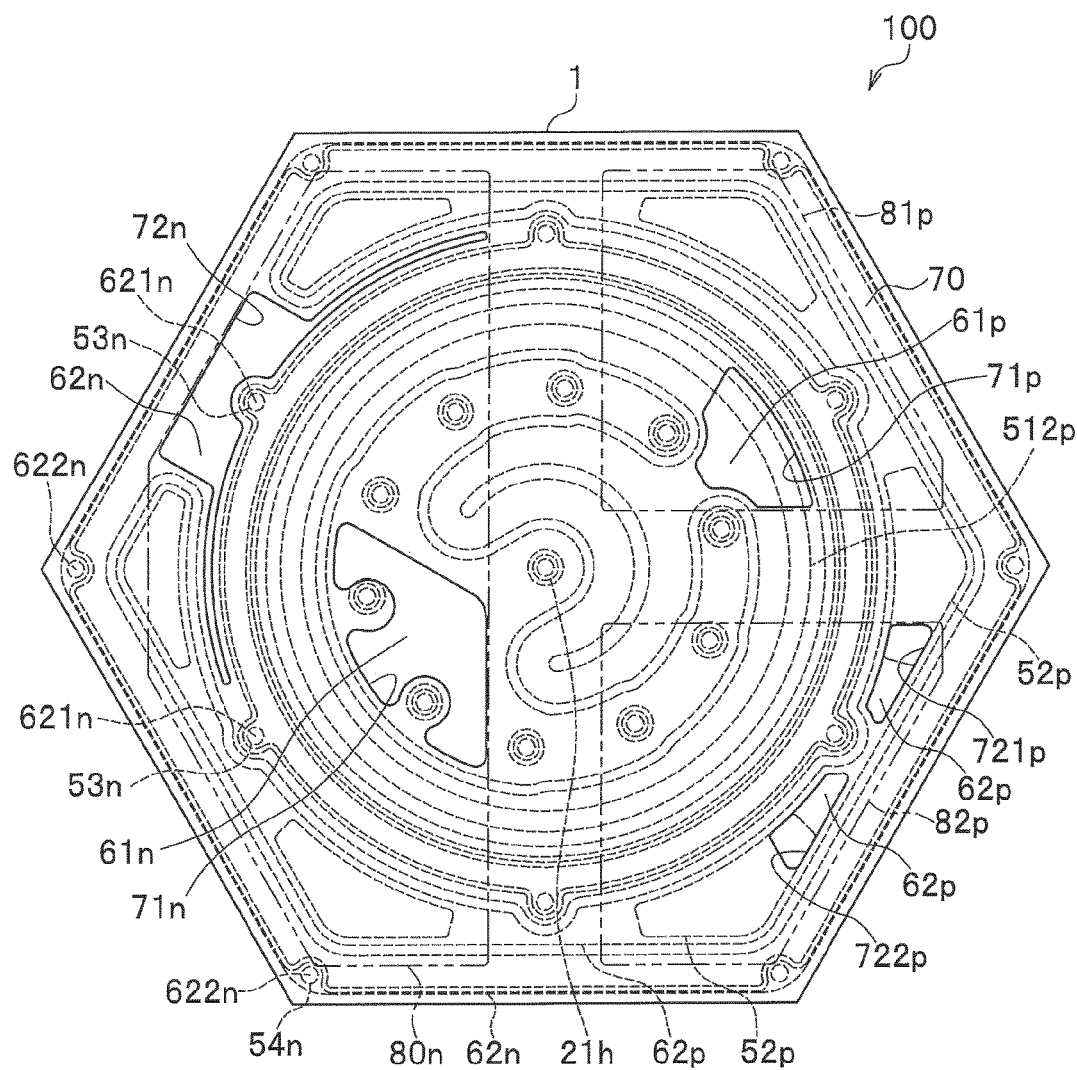
FIG. 15 is an explanatory view schematically illustrating the arrangement area of a protective film in the light-emitting device according to the first embodiment.

The protective film 70 is provided above the semiconductor stacked body 20 and functions as an insulation film that protects the light-emitting element 1 against short-circuit between the pad electrodes. As illustrated in FIG. 15, in the area where the external connection electrode 8 is arranged and above the first semiconductor area 21, the protective film 70 includes an n-side opening 71n at a position where the holes 21h are not disposed and includes a p-side opening 71p in such a manner as to overlap the part of the p-side opening 512p of the interlayer insulation film 50. The first conductive layer 61p is electrically connected to the first p-side external connection electrode 81p (anode terminal) through the p-side opening 71p of the protective film 70 above the first semiconductor area 21. That is, the p-side opening 71p serves as an electric current input section. Also, the first n-electrode 61n is electrically connected to the n-side external connection electrode 80n (cathode terminal) thought the n-side opening 71n of the protective film 70. That is, the n-side opening 71n serves as an electric current extraction section.

Also, as illustrated in FIG. 15, in the area where the external connection electrode 8 is arranged and above the second semiconductor area 22, the protective film 70 includes an n-side opening 72n at a position where the inner edge connection portions 621n and the outer edge connection portions 622n of the second n-electrode 62n are not disposed and includes p-side openings 721p an 722p in such a manner as to include part of the p-side opening 52p of the interlayer insulation film 50. The second conductive layer 62p is electrically connected to the second p-side external connection electrode 82p (anode terminal) through the p-side openings 721p and 722p of the protective film 70 above the second semiconductor area 22. That is, the p-side openings 721p and 722p of the protective film 70 serve as the electric current input section. Also, the second n-electrode 62n is electrically connected to the n-side external connection electrode 80n (cathode terminal) through the n-side opening 72n of the protective film 70. That is, the n-side opening 72n of the protective film 70 serves as the electric current extraction section.

As the aforementioned protective film 70, as is the same with the interlayer insulation film 50, metal oxides or metal nitrides can be used.

[External Connection Electrode 8]

As illustrated in FIG. 5, the n-side external connection electrode 80n is provided on the side (left in FIG. 5) of one edge of the rectangular light-emitting element 1 in a plan view (bottom view). Also, the first p-side external connection electrode 81p is provided on the side (upper right in FIG. 5) of the other edge opposite to the one edge. Furthermore, the second p-side external connection electrode 82p is also provided on the side (lower right in FIG. 5) of the other edge.

The n-side external connection electrode 80n, the first p-side external connection electrode 81p, and the second p-side external connection electrode 82p are separated from each other with a predetermined distance apart on the surface of the light-emitting element 1.

Herein, in the case of being viewed form a lower surface, the shape of the n-side external connection electrode 80n is an approximately hexagonal shape, and the shape of the first p-side external connection electrode 81p and the second p-side external connection electrode 82p is an approximately trapezoidal shape. Also, it is formed in such a manner that the size of the p-side electrode is less than half the size of the n-side electrode. Also, the p-side external connection electrodes, comprised of the first p-side external connection electrode 81p and the second p-side external connection electrode 82p, are arranged so as to be approximately symmetrical about the n-side external connection electrode 80n on the surface of the light-emitting element 1. Furthermore, the first p-side external connection electrode 81p and the second p-side external connection electrode 82p are approximately vertically symmetrical on the surface of the light-emitting element 1.

It is noted that the external connection electrode 8 can be freely arranged at a desired position, irrespective of the arrangement of the first semiconductor area 21 and the second semiconductor area 22 of the light-emitting element 1 and the arrangement of the pad electrodes. In the present embodiment, the n-side external connection electrode 80n is connected to the first n-electrode 61n and the second n-electrode 62n. Also, the first p-side external connection electrode 81p is connected to the first conductive layer 61p. Furthermore, the second p-side external connection electrode 82p is connected to the second conductive layer 62p. As the materials of the external connection electrode 8, the metal such as Cu, Au, and Ni can be preferably used, and a single layer or multiple layers made of the aforementioned metal materials can be used. The external connection electrode 8 can be formed by an electrolytic plating method.

At the time of the mounting, an adhesive member is provided between the external connection electrode 8 and the wiring pattern of the outside, and the adhesive member is fused and subsequently cooled, thereby firmly joining the external connection electrode 8 with the wiring patterns of the outside. Herein, solder made of Sn—Au, Sn—Cu, and Sn—Ag—Cu as the adhesive member can be used. In this case, it is preferable that the uppermost layer of the external connection electrode 8 be constituted of materials having good adhesion properties with respect to the adhesive member to be used.

[Operation of Light-Emitting Device]

Next, the operation of the light-emitting device 100 will be described referring to FIGS. 1 to 10. As for the light-emitting device 100, in the case where an external power source is connected to the first p-side external connection electrode 81p and the n-side external connection electrode 80n via the mounting substrate, an electric current is supplied between the first p-electrode (the first light reflective layer 31p) of the light-emitting element 1 and the first n-electrode 61n. Accordingly, the first active layer 21a of the light-emitting element 1 emits light. The light is transmitted in the first semiconductor area 21 of the semiconductor stacked body 20 and taken out from the upper surface and the lateral surface (see FIG. 2) of the light-emitting element 1 to the outside. It is noted that the light transmitted in the light-emitting element 1 in the downward direction is reflected by the first light reflective layer 31p and taken out from the upper surface of the light-emitting element 1 to the outside.

As for the light-emitting device 100, in the case where the external power source is connected to the second p-side external connection electrode 82p and the n-side external connection electrode 80n via the mounting substrate, an electric current is supplied between the second p-electrode (the second light reflective layer 32p) of the light-emitting element 1 and the second n-electrode 62n. Accordingly, the second active layer 22a of the light-emitting element 1 emits light. The light is transmitted in the second semiconductor area 22 of the semiconductor stacked body 20 and taken out from the upper surface and the lateral surface (see FIG. 2) of the light-emitting element 1 to the outside. It is noted that the light transmitted in the light-emitting element 1 in the downward direction is reflected by the second light reflective layer 32p and taken out from the upper surface of the light-emitting element 1 to the outside.

Thus, in the light-emitting device 100, the electric current can be independently supplied with the external connection electrode 8 respectively to the first semiconductor area 21 (a first light emission portion), in which the first p-side semiconductor layer 21p is stacked, and the second semiconductor area 22 (a second light emission portion), in which the second p-side semiconductor layer 22p provided in the periphery of the first semiconductor area 21 is stacked, above one n-side semiconductor layer 21n, so that the light emission intensity of the first light emission portion and the second light emission portion can be independently controlled.

On the other hand, as seen in the conventional technologies disclosed in WO2009/019836, in the case where the sole n-electrode (cathode electrode) is connected to the first light emission portion (edge portion) or the second light emission portion (area on the inside of the edge portion), the electric current is deviated to the light emission portions connected to the n-electrode, and the distribution of electric current density is such that the electric current density tends to become higher in proportion to a distance to the n-electrode in the surfaces of the respective light emission portions. In contrast, as for the light-emitting device 100, different n-electrodes (the first n-electrode 61n and the second n-electrode 62n) are respectively connected to the first semiconductor area 21 (the first light emission portion) and the second semiconductor area 22 (the second light emission portion). Accordingly, in the light-emitting element 1, an electric current path leading from the first n-electrode 61n to the first p-electrode (the first light reflective layer 31p) above the first semiconductor area 21 and an electric current path leading from the second n-electrode 62n to the second p-electrode (the second light reflective layer 32p) above the second semiconductor area 22 can be provided. Consequently, the light-emitting element 1 can alleviate the deviation of the electric current, compared with conventional light-emitting elements. Accordingly, the deviation of the electric current density in the light-emitting element 1 can be alleviated, so that the light-emitting device 100 using the light-emitting element 1 can improve the intensity distribution of light emission.

In the case where a blue light-emitting diode is used in the light-emitting device 100, and a first phosphor layer 91 of the wavelength conversion member 9 includes YAG based phosphors, the light from the first semiconductor area 21 of the light-emitting element 1 is converted into white light through the first phosphor layer 91. Also, in the case where a second phosphor layer 92 of the wavelength conversion member 9 includes SiAlON based phosphors, the light from the second semiconductor area 22 of the light-emitting element 1 is converted into orange light through the second phosphor layer 92.

Accordingly, as for the light source device 2, in the case where the light emission is made only by the first semiconductor area 21 of the light-emitting element 1, the white light is emitted from the wavelength conversion member 9, and in the case where the light emission is made only by the second semiconductor area 22, the orange light is emitted from the wavelength conversion member 9. Also, as for the light source device 2, in the case where the light emission is simultaneously made by the first semiconductor area 21 and the second semiconductor area 22 of the light-emitting element 1, both of the white light and the orange light are emitted from the wavelength conversion member 9, and the Fresnel lens 6 condenses the aforementioned light. Accordingly, the light source device 2 can perform light control so as to provide more natural white light that excels in color rendering.

Also, as illustrated in FIG. 1, in the light source device 2, the entire light emission surfaces of the first phosphor layer 91 and the second phosphor layer 92 concentrically formed with respect to the wavelength conversion member 9 are provided in such a manner as to be covered with a sheet of circular Fresnel lens 6 while the center of the concentric circle thereof corresponds to the optical axis of the Fresnel lens 6. Accordingly, the light source device 2 can be of a small size and beautiful appearance compared with conventional light source in which, for example, two condenser lenses are provided and arranged side by side for every phosphor layer.

As described above, the light-emitting element 1 is a hexagonal dice that includes the light transmissive substrate 10 formed in a regular hexagonal shape in a plan view and includes the second light emission portion (the second semiconductor area 22) for which the outer edge has a hexagonal shape in a plan view. Compared with the light-emitting element (dice) of which the outer edge has a quadrangle (a regular square) shape, in the case where the size (the length of a diagonal line viewed from an upper surface) of a hexagonal dice is the same with the size of a quadrilateral dice, the area of the light emission portion occupied with respect to the Fresnel lens 6 can be widely set with the hexagonal dice rather than the quadrilateral dice. Accordingly, in the case where a circular light emission portion is provided in the dice, a marginal portion (non-light emission portion), which does not contribute to light emission, is reduced in the hexagonal dice, compared with the quadrilateral dice. Consequently, a circular Fresnel lens 6 can be efficiently utilized with the hexagonal dice rather than the quadrilateral dice. Also, the periphery of the light-emitting element 1 is covered with the light reflective member 7b. Accordingly, in the case where the external edge shape of the light-emitting element 1 is formed in a hexagon near to a circle rather than a square with respect to a second light emission portion, compatibility with the Fresnel lens 6 is further improved, and a distance from the second light emission portion to the light reflective member 7b can be reduced, so that the light can be efficiently reflected on the side of the light emission surface.

Second Embodiment

Figure 16:
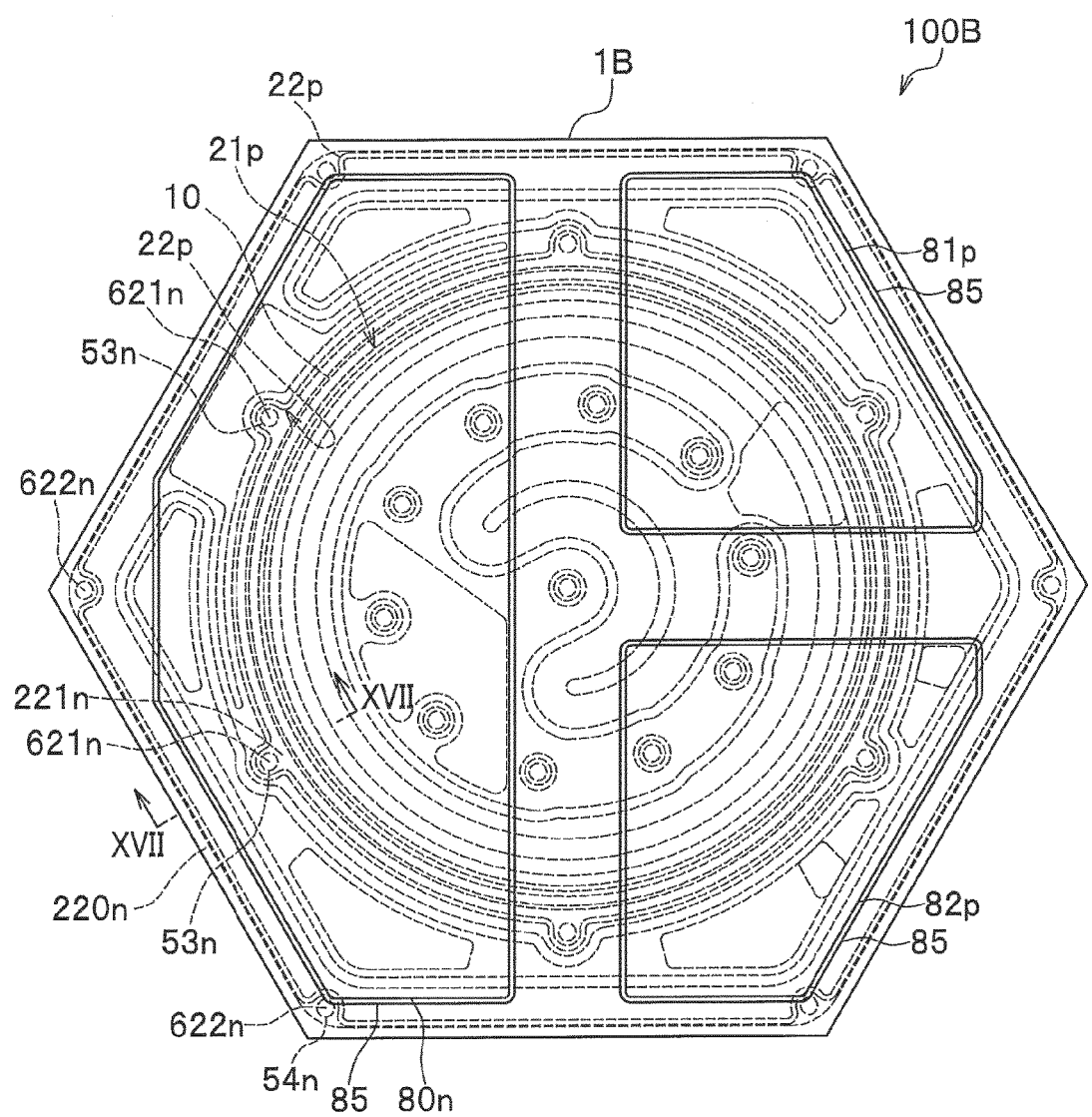
FIG. 16 is a bottom view schematically illustrating the light-emitting device according to a second embodiment.
Figure 17:
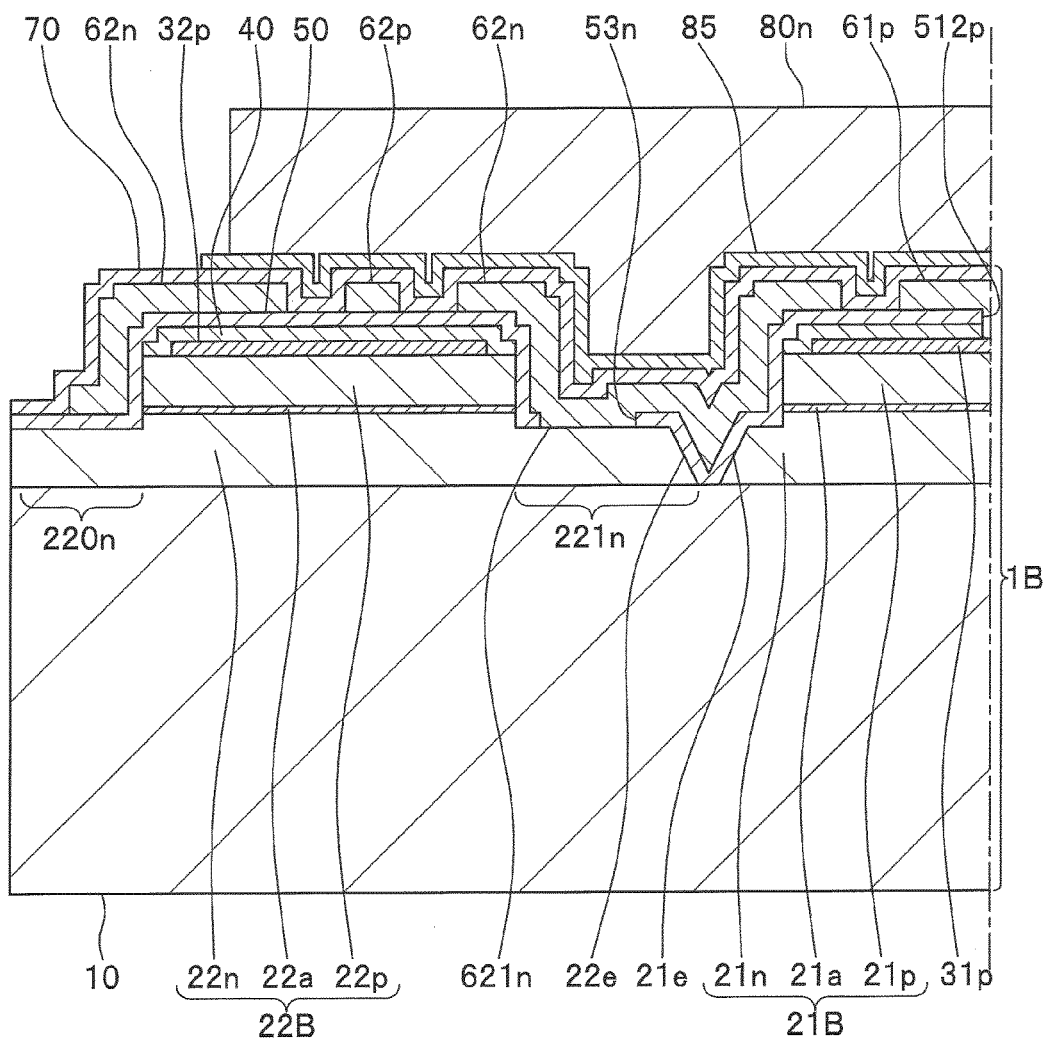
FIG. 17 is a schematic cross-sectional view taken along a line XVII-XVII in FIG. 16.

As illustrated in FIGS. 16 and 17, a light-emitting element 1B and a light-emitting device 100B according to a second embodiment are different from the light-emitting element 1 and the light-emitting device 100 according to the first embodiment in that two semiconductor stacked bodies are provided. Hereinafter, the same reference numbers are applied to the same constitution of the light-emitting device 100, and therefore its description is omitted. The light-emitting device 100B includes the light-emitting element 1B and the external connection electrode 8 (the n-side external connection electrode 80n, the first p-side external connection electrode 81p, and the second p-side external connection electrode 82p).

In the first embodiment, the semiconductor stacked body 20 includes one n-side semiconductor layer 21n on the light transmissive substrate 10, but in the second embodiment, n-side semiconductor layers are separated for each light emission layer on the light transmissive substrate 10, two semiconductor stacked bodies 20 are substantially provided. Accordingly, the first semiconductor area 21 is also referred to as a first semiconductor stacked body 21B. Also, the second semiconductor area 22 is also referred to as a second semiconductor stacked body 22B.

As illustrated on the right side of FIG. 17, the first semiconductor stacked body 21B includes a first n-side semiconductor layer 21n, a first active layer 21a, and a first p-side semiconductor layer 21p, which are provided on the light transmissive substrate 10. As illustrated on the left side of FIG. 17, the second semiconductor stacked body 22B includes a second n-side semiconductor layer 22n, a second active layer 22a, and a second p-side semiconductor layer 22p, which are provided on the light transmissive substrate 10. The second n-side semiconductor layer 22n is provided around the periphery of the first semiconductor stacked body 21B in a plan view. As illustrated in FIG. 17, the second p-side semiconductor layer 22p is provided above the second n-side semiconductor layer 22n and located outside (left side in FIG. 17) of an inner edge portion 221n of the second n-side semiconductor layer 22n. The second p-side semiconductor layer 22p is arranged inwardly (right side in FIG. 17) with respect to an outer edge portion 220n of the second n-side semiconductor layer 22n in a plan view. As illustrated in FIG. 17, the light-emitting element 1B, between the first semiconductor stacked body 21B (first light emission portion) and the second semiconductor stacked body 22B (second light emission portion), the p-side semiconductor layer, the active layer, and the n-side semiconductor layer are removed above the light transmissive substrate 10. On the light transmissive substrate 10 where these semiconductor layers are removed, the interlayer insulation film 50 or the like is stacked.

As illustrated in FIG. 17, the second n-electrode 62n is provided above part of the second p-electrode (the second light reflective layer 32p) and connected to the inner edge portion 221n of the second n-side semiconductor layer 22n. The second n-electrode 62n includes the plurality of inner edge connection portions 621n (see FIGS. 16 and 17) connected to the inner edge portion 221n of the second n-side semiconductor layer 22n. The plurality of inner edge connection portions 621n are arranged along the inner edge portion of the second p-side semiconductor layer 22p. The second n-electrode 62n includes the plurality of outer edge connection portions 622n (see FIG. 16) connected to the outer edge portion 220n of the second n-side semiconductor layer 22n. The outer edge connection portions 622n are respectively arranged at the corner portions of the light transmissive substrate 10, that is, corner portions corresponding to vertices of the hexagonal shape, on the outer edge of the second p-side semiconductor layer 22p.

In the light-emitting device 100B according to the second embodiment, the electric current can be completely independently supplied with the external connection electrode 8 respectively to the first semiconductor stacked body 21B (the first light emission portion) where the first p-side semiconductor layer 21p is stacked above the first n-side semiconductor layer 21n, and the second semiconductor stacked body 22B (the second light emission portion) provided around the periphery of the first light emission portion, where the second p-side semiconductor layer 22p is stacked above the second n-side semiconductor layer 22n. Accordingly, the light emission intensity of the first light emission portion and the second light emission portion can be more independently controlled. Also, in the light-emitting device 100B, the first semiconductor stacked body 21B and the second semiconductor stacked body 22B are provided in such a manner as to be separated from each other on the light transmissive substrate 10, so that the light transmitted in the respective n-side semiconductor layers 21n and 22n in the lateral direction can be reflected with separation end surfaces 21e and 22e (see FIG. 17). Accordingly, in the case where the first phosphor layer 91 and the second phosphor layer 92 are provided on the side (the lower side in FIG. 17) of the light extraction surface of the light-emitting element 1B, the light emission with the first phosphor layer 91 and the light emission with the second phosphor layer 92 can be more selectively made.

As described above, several embodiments of the present invention have been exemplified. However needless to say, the present invention is not limited to the aforementioned embodiments but can be freely modified as long as it does not depart from the gist of the present invention.

What is claimed is:
1. A light-emitting element comprising:
   a light transmissive substrate;
   a first semiconductor stacked body including:
      a first n-side semiconductor layer located above part of the light transmissive substrate, and
      a first p-side semiconductor layer located above the first n-side semiconductor layer, the first p-side semiconductor layer having a hole formed therein;
   a first p-electrode located on the first p-side semiconductor layer;
   a first n-electrode having a portion above the first p-electrode, and a portion extending into the hole, the first n-electrode being electrically connected to the first n-side semiconductor layer through the hole;
   a second semiconductor stacked body including:
      a second n-side semiconductor layer located above the light transmissive substrate around a periphery of the first semiconductor stacked body in a plan view, and a second p-side semiconductor layer located above the second n-side semiconductor layer and located outside of an inner edge portion of the second n-side semiconductor layer;
a second p-electrode located on the second p-side semiconductor layer; and
a second n-electrode having a portion above the second p-electrode, and being electrically connected to the inner edge portion of the second n-side semiconductor layer.

2. The light-emitting element according to claim 1, wherein a plurality of holes are formed in the first p-side semiconductor layer, and the plurality of holes are arranged along an outer edge portion of the first p-side semiconductor layer.

3. The light-emitting element according to claim 2, wherein the first n-electrode extends along an arrangement direction of the plurality of holes and integrally connects the plurality of holes.

4. The light-emitting element according to claim 3, wherein the first p-electrode includes:
a first light reflective layer located on approximately an entire upper surface of the first p-side semiconductor layer, and
a first conductive layer located on the first light reflective layer,
wherein the first conductive layer has a first connection portion and a second connection portion each of which is connected to the first light reflective layer,
wherein each of the first connection portion and the second connection portion has a shape corresponding to an outer edge shape of the first p-side semiconductor layer in the plan view,
wherein the first connection portion and the second connection portion are respectively located in an inner area and an outer area of a region encircled by an imaginary line connecting the plurality of holes along the outer edge portion of the first p-side semiconductor layer in the plan view, and
wherein a width of the second connection portion is larger than a width of the first connection portion.

5. A light-emitting device comprising:
the light-emitting element according to claim 3; and
an n-side external connection electrode located on a side of the light-emitting element, the side being opposite to the light transmissive substrate, the n-side external connection electrode being connected to the first n-electrode,
wherein the first n-electrode includes two arc portions each having an arc shape and extending from a connection portion where the first n-electrode is connected to the n-side external connection electrode in the plan view, and
wherein a width of each of the two arc portions in the connection portion where the first n-electrode is connected to the n-side external connection electrode is larger than a width of a tip end portion of each respective arc portion.

6. The light-emitting element according to claim 1, wherein an outer edge of the first p-side semiconductor layer has a circular shape in the plan view.

7. The light-emitting element according to claim 1, wherein the second n-electrode includes a plurality of inner edge connection portions electrically connected to the inner edge portion of the second n-side semiconductor layer, and
wherein the plurality of inner edge connection portions are arranged along an inner edge portion of the second p-side semiconductor layer.

8. The light-emitting element according to claim 7, wherein the plurality of inner edge connection portions are arranged nearer to the second p-side semiconductor layer than to the first p-side semiconductor layer.

9. The light-emitting element according to claim 7, wherein an outer edge of the second p-side semiconductor layer has a hexagonal shape in the plan view, and the second p-side semiconductor layer is arranged inwardly with respect to an outer edge portion of the second n-side semiconductor layer in the plan view,
wherein the second n-electrode includes a plurality of outer edge connection portions electrically connected to the outer edge portion of the second n-side semiconductor layer, and
wherein the plurality of outer edge connection portions are respectively arranged at corner portions corresponding to vertices of the hexagonal shape.

10. The light-emitting element according to claim 9, wherein the plurality of inner edge connection portions of the second n-electrode and the plurality of outer edge connection portions of the second n-electrode are alternately arranged in a circumferential direction.

11. A light-emitting device comprising:
the light-emitting element according to claim 1; and
an external connection electrode located on a side of the light-emitting element, the side being opposite to the light transmissive substrate,
wherein the external connection electrode includes:
an n-side external connection electrode connected to the first n-electrode and the second n-electrode;
a first p-side external connection electrode connected to the first p-electrode; and
a second p-side external connection electrode connected to the second p-electrode.

12. The light-emitting device according to claim 11, wherein the second p-electrode of the light-emitting element includes:
a second light reflective layer connected to approximately an entire upper surface of the second p-side semiconductor layer; and
a second conductive layer located on the second light reflective layer and connected to the second p-side external connection electrode.

13. The light-emitting device according to claim 11, further comprising:
a wavelength conversion member on a side of the light transmissive substrate of the light-emitting element,
wherein the wavelength conversion member includes:
a first phosphor layer covering the first p-side semiconductor layer in the plan view, and
a second phosphor layer located around a periphery of the first phosphor layer and covering the second p-side semiconductor layer in the plan view.

14. The light-emitting device according to claim 13, further comprising a Fresnel lens located on a surface side of the wavelength conversion member, the surface side being opposite to the light transmissive substrate.

15. A light-emitting element comprising:
a light transmissive substrate;
one n-side semiconductor layer located above the light transmissive substrate;
a first p-side semiconductor layer located above part of the n-side semiconductor layer, the first p-side semiconductor layer having a hole formed therein;

a first p-electrode located on the first p-side semiconductor layer;

a first n-electrode having a portion above the first p-electrode, and a portion extending into the hole, the first n-electrode being electrically connected to the n-side semiconductor layer through the hole;

a second p-side semiconductor layer located above the n-side semiconductor layer around a periphery of the first p-side semiconductor layer in a plan view;

a second p-electrode located on the second p-side semiconductor layer; and a second n-electrode having a portion above the second p-electrode, and being electrically connected to the n-side semiconductor layer in an area between the first p-side semiconductor layer and the second p-side semiconductor layer.

16. The light-emitting element according to claim 15, wherein the second n-electrode includes a plurality of inner edge connection portions electrically connected to the n-side semiconductor layer, and wherein the plurality of inner edge connection portions are arranged along an inner edge portion of the second p-side semiconductor layer.

17. The light-emitting element according to claim 16, wherein the plurality of inner edge connection portions are arranged nearer to the second p-side semiconductor layer than to the first p-side semiconductor layer.

18. The light-emitting element according to claim 16, wherein an outer edge of the second p-side semiconductor layer has a hexagonal shape in the plan view, and the second p-side semiconductor layer is arranged inwardly with respect to an outer edge portion of the n-side semiconductor layer in the plan view, wherein the second n-electrode includes a plurality of outer edge connection portions electrically connected to the outer edge portion of the n-side semiconductor layer, and wherein the plurality of outer edge connection portions are respectively arranged at corner portions corresponding to vertices of the hexagonal shape.

19. The light-emitting element according to claim 18, wherein the plurality of inner edge connection portions of the second n-electrode and the plurality of outer edge connection portions of the second n-electrode are alternately arranged in a circumferential direction.

* * * * *